US007644386B1

(12) United States Patent
Chan et al.

(10) Patent No.: US 7,644,386 B1
(45) Date of Patent: Jan. 5, 2010

(54) REDUNDANCY STRUCTURES AND METHODS IN A PROGRAMMABLE LOGIC DEVICE

(75) Inventors: Michael Chan, Ontario (CA); Paul Leventis, Ontario (CA); David Lewis, Ontario (CA); Ketan Zaveri, San Jose, CA (US); Hyun Mo Yi, Mountain View, CA (US); Chris Lane, San Jose, CA (US)

(73) Assignee: Altera Corporation, San Jose, CA (US)

( * ) Notice: Subject to any disclaimer, the term of this patent is extended or adjusted under 35 U.S.C. 154(b) by 178 days.

(21) Appl. No.: 11/623,903

(22) Filed: Jan. 17, 2007

Related U.S. Application Data

(62) Division of application No. 10/856,434, filed on May 28, 2004, now Pat. No. 7,180,324.

(51) Int. Cl.
*G06F 17/50* (2006.01)
(52) U.S. Cl. .......................................... 716/16; 716/18
(58) Field of Classification Search ................... 716/16, 716/18
See application file for complete search history.

(56) References Cited

U.S. PATENT DOCUMENTS

| 4,899,067 | A |   | 2/1990  | So et al.        |        |
|-----------|---|---|---------|------------------|--------|
| 5,260,611 | A |   | 11/1993 | Cliff et al.     |        |
| 5,349,248 | A | * | 9/1994  | Parlour et al.   | 326/38 |
| 5,369,314 | A |   | 11/1994 | Patel et al.     |        |
| 5,434,514 | A |   | 7/1995  | Cliff et al.     |        |
| 5,475,830 | A | * | 12/1995 | Chen et al.      | 716/16 |
| 5,498,979 | A | * | 3/1996  | Parlour et al.   | 326/38 |
| 5,592,102 | A |   | 1/1997  | Lane et al.      |        |
| 5,777,887 | A | * | 7/1998  | Marple et al.    | 716/4  |
| 5,926,036 | A |   | 7/1999  | Cliff et al.     |        |
| 6,034,536 | A |   | 3/2000  | McClintock et al.|        |
| 6,107,820 | A |   | 8/2000  | Jefferson et al. |        |
| 6,167,558 | A | * | 12/2000 | Trimberger       | 716/16 |
| 6,201,404 | B1|   | 3/2001  | Reddy et al.     |        |
| 6,237,131 | B1| * | 5/2001  | MacArthur et al. | 716/16 |
| 6,344,755 | B1|   | 2/2002  | Reddy et al.     |        |
| 6,404,226 | B1|   | 6/2002  | Schadt           |        |
| 6,526,559 | B2| * | 2/2003  | Schiefele et al. | 716/16 |
| 6,545,501 | B1|   | 4/2003  | Bailis et al.    |        |
| 6,600,337 | B2|   | 7/2003  | Nguyen et al.    |        |
| 6,605,962 | B2|   | 8/2003  | Lee et al.       |        |
| 6,630,842 | B1|   | 10/2003 | Lewis et al.     |        |

(Continued)

OTHER PUBLICATIONS

Chapman, "FPGA Design for Decemiter Scale Integration (DMSI)", 1998 IEEE International Symposium on Defect and Fault Tolerance in VLSI Systems, Nov. 2-4, 1998, pp. 64-72.*

(Continued)

*Primary Examiner*—Phallaka Kik
(74) *Attorney, Agent, or Firm*—Weaver Austin Villeneuve and Sampson LLP

(57) ABSTRACT

An embodiment of the present invention provides a programmable logic device ("PLD") including a redundancy architecture adapted to selective route signals via first or second staggered vertical lines. Other embodiments provide configuration logic and programs for determining routing selections. Other embodiments provide proximate grouping of vertical lines driven from a same row. Other embodiments provide definition of spare row locations once defective row locations are known.

19 Claims, 15 Drawing Sheets

U.S. PATENT DOCUMENTS

| | | | |
|---|---|---|---|
| 6,653,862 | B2 | 11/2003 | Johnson et al. |
| 6,826,741 | B1 | 11/2004 | Johnson et al. |
| 2001/0006347 | A1 | 7/2001 | Jefferson et al. |
| 2002/0166106 | A1 | 11/2002 | Lewis et al. |
| 2003/0072185 | A1 | 4/2003 | Lane et al. |

OTHER PUBLICATIONS

Fukushi et al., "A Self-Reconfigurable Hardware Architecture for Mesh Arrays Using SIngle/Double Vertical Track Switches", IEEE Transactions on Intrumentation and Measurement, vol. 53, No. 2, Apr. 2004, pp. 357-367.*

U.S. Appl. No. 10/449,962, filed May 30, 2003.

U.S. Appl. No. 10/452,673, filed May 30, 2003.

U.S. Appl. No. 11/015,568, filed Dec. 18, 2004.

Hatori, F. et al. (1993) "Introducing Redundancy in Field Programmable Gate Arrays," IEEE Custom Integrated Circuits Conference, pp. 7.1.1.-7.1.4.

Kluwer Academic Publishers, Vaughn Betz, Jonathan Rose, Alexander Marquardt, *Architecture and CAD for Deep-Submicron FPGAs*, Chapter 2.1 (pp. 11-18), Chapter 4 (pp. 63-103), Chapter 5 (pp. 105-126), and Chapter 7 (pp. 151-190), (Mar. 1999).

European Examination Report in related European Application 05 253 252.0, mailed Jun. 15, 2007.

Restriction Requirement dated Oct. 6, 2005 for U.S. Appl. No. 10/856,434.

Office Action dated Apr. 26, 2006 for U.S. Appl. No. 10/856,434.

Notice of Allowance dated Oct. 30, 2006 for U.S. Appl. No. 10/856,434.

European Examination Report dated May 9, 2008 from EP Application No. 05 253 252.0.

European Examination Report dated Jun. 15, 2007 from EP Application No. 05 253 252.0.

European Search Report dated Sep. 6, 2006 from EP Application No. 05 253 252.0.

\* cited by examiner

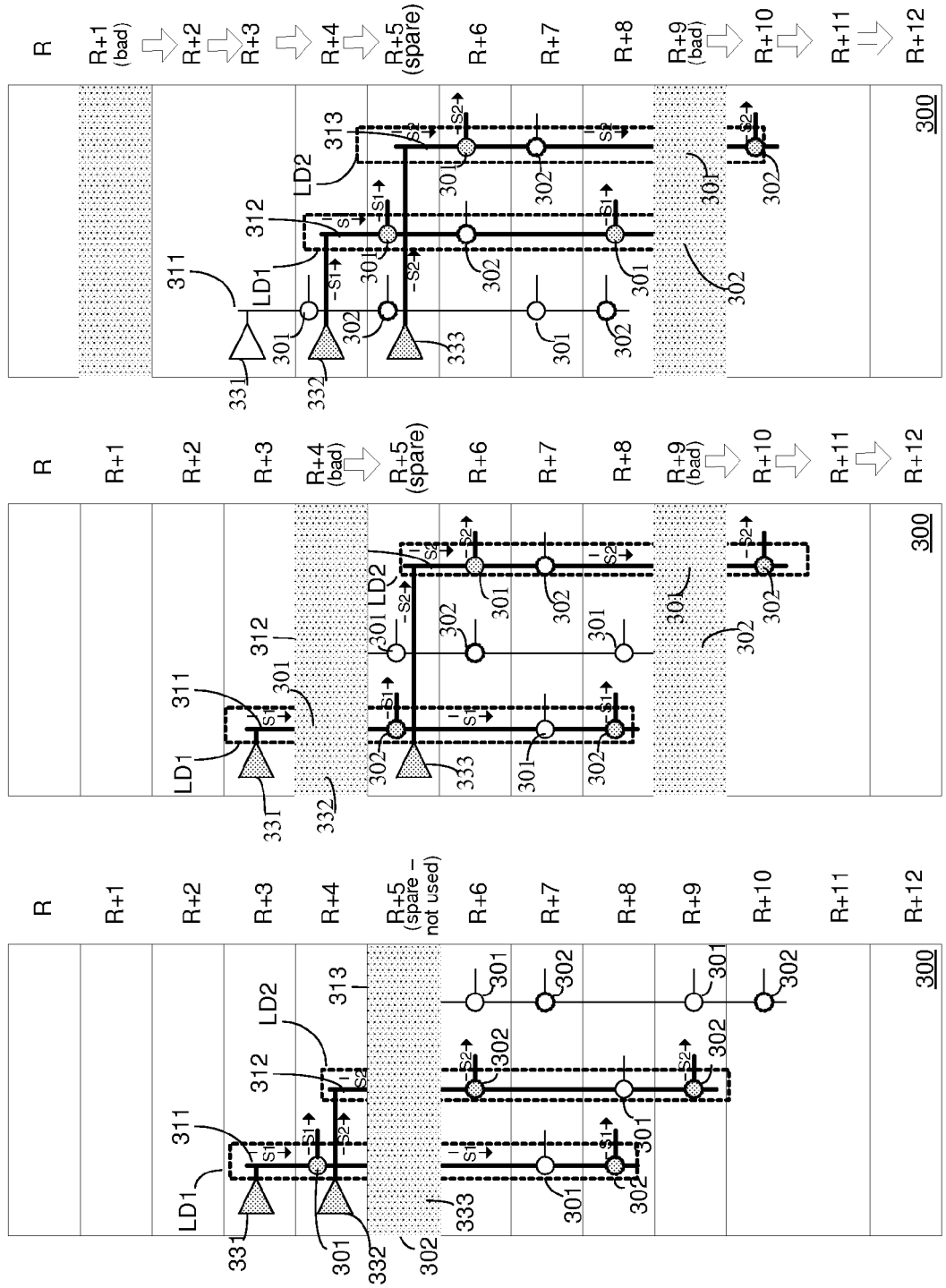

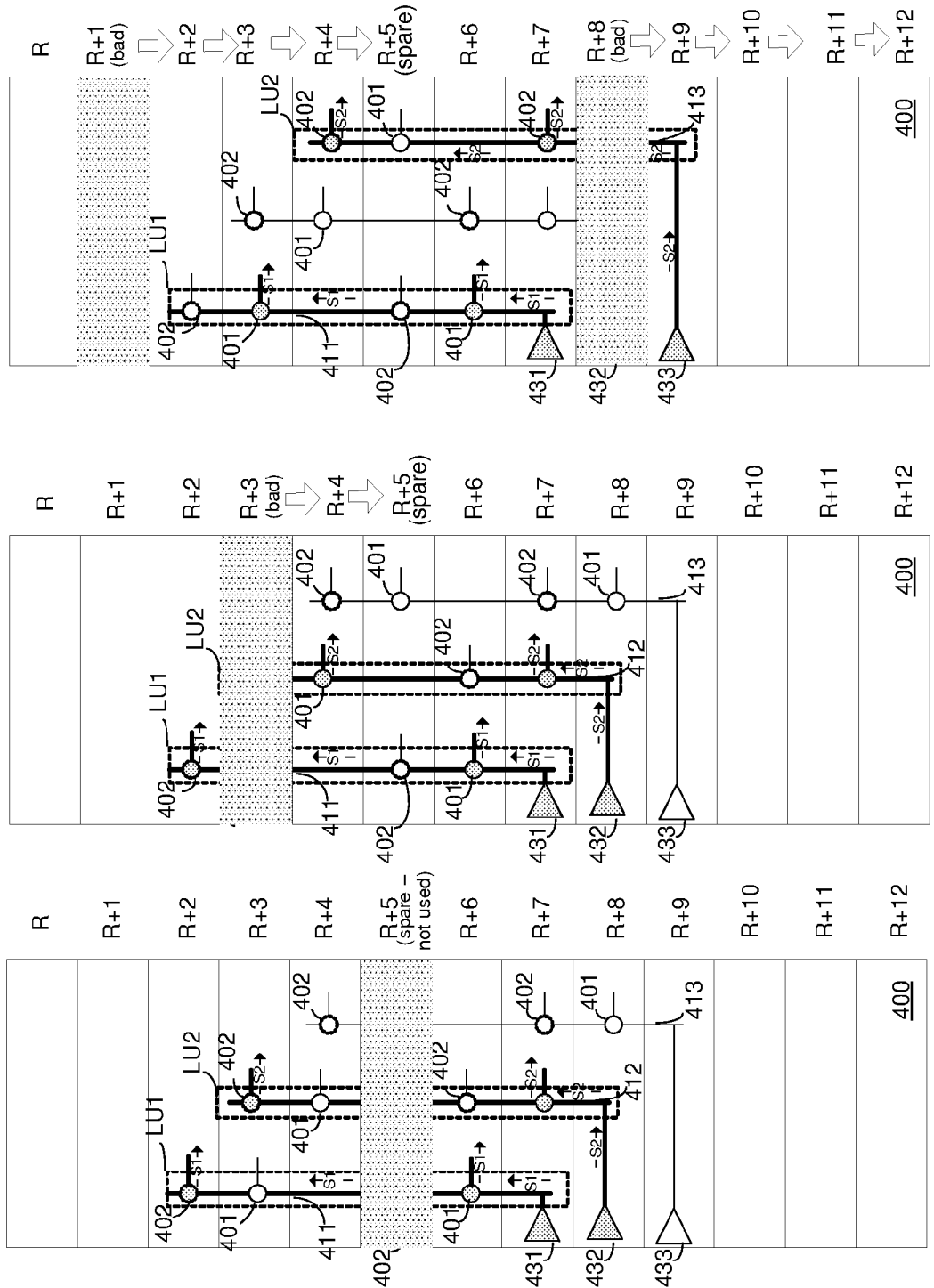

REDUNDANCY STRUCTURES AND METHODS IN A PROGRAMMABLE LOGIC DEVICE

CROSS-REFERENCE TO RELATED APPLICATIONS

This application is a divisional of U.S. patent application Ser. No. 10/856,434 filed on May 28, 2004, now U.S. Pat. No. 7,180,324 which is incorporated by reference.

BACKGROUND OF THE INVENTION

1. Field of the Invention

The present invention relates to programmable logic devices having redundant circuitry.

2. Description of Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. LABs (comprising multiple LEs) may be connected to horizontal and vertical lines that may or may not extend the length of the PLD.

PLDs have configuration elements that may be programmed or reprogrammed. Configuration elements may be realized as RAM bits, flip-flops, EEPROM cells, or other memory elements. Placing new data into the configuration elements programs or reprograms the PLD's logic functions and associated routing pathways. Configuration elements that are field programmable are often implemented as RAM cells (sometimes referred to as "CRAM" or "configuration RAM"). However, many types of configurable elements may be used including static or dynamic random access memory, electrically erasable read-only memory, flash, fuse, and antifuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by or routing between other PLD elements.

PLDs having redundant circuitry can help improve production yields by providing regions on the device that can be repaired by engaging the redundant circuitry. A row based redundancy scheme typically provides at least one redundant or "spare" row in an array of logic circuitry (e.g. an array of LABs and associated routing). Row based redundancy schemes are described, for example, in commonly assigned U.S. Pat. Nos. 6,201,404 (entitled "Programmable Logic Device with Redundant Circuitry") and 6,344,755 (entitled "Programmable Logic Device with Redundant Circuitry") and are further described in commonly assigned pending U.S. patent application Ser. No. 10/159,581 (entitled "Programmable Logic Device with Redundant Circuitry"). Typically, a repairable region may be defined above the spare row such that, if one of the rows of the logic array is defective, the spare row is activated and each row from the spare row to the bad row replaces the next higher row, thus repairing the defective region.

SUMMARY OF THE INVENTION

In one respect, if routing redundancy in a row-shifting redundancy scheme requires driving the same physical line from a different row depending on whether redundancy is engaged, a single vertical line may require an extra driver for redundancy in a redundant mode row below a normal mode driving row. However, in the context of vertical lines that are staggered, it is possible to selectively utilize one vertical line or another vertical line in order to effectively shift the row (or rows) from which a particular signal would otherwise be driven and received. Such selective use of a first or second vertical line for signal routing has the potential to help reduce the need for additional drivers in a row-shifting redundancy scheme.

In another and different respect, the amount of on-chip logic needed for implementing a particular redundancy scheme may be minimized if at least some of the necessary determinations related to implementing the redundancy scheme occur off chip in the configuration program that generates programming data.

In another and different respect, in a staggered segmented routing architecture, it is possible that a defect will damage adjacent lines in a track group. If staggered lines are grouped such that lines having different drive points are adjacent, the reparability of the part may be limited. Thus, there is a need for a grouping scheme in a staggered segmented routing architecture that better maximizes reparability.

In another and different respect, opportunities for repair may be restrained if spare row locations must be pre-designated before the locations of defective rows are known. Thus, there is a potential benefit in being able to define spare row locations after defective row locations are known.

In one aspect, some embodiments of the present invention implement a redundancy scheme to selectively route from first or second vertical lines. In another aspect, some embodiments of the present invention implement a redundancy scheme by programming configuration elements that control inputs of a routing input mux coupled to vertical lines. In some embodiments, the configuration elements are treated as pairs; also, mux inputs and stages are organized so that the configuration element pairs are in a same frame of configuration elements. In other embodiments, the pairs of configuration elements are also consecutive. In yet other embodiments, the configuration elements are treated separately and two configuration elements controlling relevant mux inputs may be non-consecutive and in different frames of configuration elements. In another aspect, various embodiments of the present invention may employ a variety of divisions between on-chip hardware and off-chip software to implement a redundancy scheme. In another aspect, some embodiments include vertical lines having both upstream and downstream connections relative to a driver row. In yet another aspect, some embodiments of the present invention provide proximate grouping of vertical lines driven from the same row to maximize reparability of multi-line defects. In yet another aspect, some embodiments of the invention may allow for "on-the-fly" definition of spare row location to further maximize repair.

BRIEF DESCRIPTION OF THE DRAWINGS

The novel features of the invention are set forth in the appended claims. However, for purpose of explanation, several aspects of particular embodiments of the invention are described by reference to the following figures.

FIGS. 3a-3c illustrate routing from downstream vertical lines crossing a spare row for selected rows in a portion 300 of a PLD operating in normal (FIG. 3a) and redundant (FIGS. 3b-3c) modes in accordance with an embodiment of the present invention.

FIGS. 4a-4c illustrate routing from upstream vertical lines for selected rows crossing a spare row in a portion 400 of a PLD operating in normal (FIG. 4a) and redundant (FIGS. 4b-4c) modes in accordance with an embodiment of the present invention.

DETAILED DESCRIPTION OF THE EXEMPLARY EMBODIMENTS

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1C:
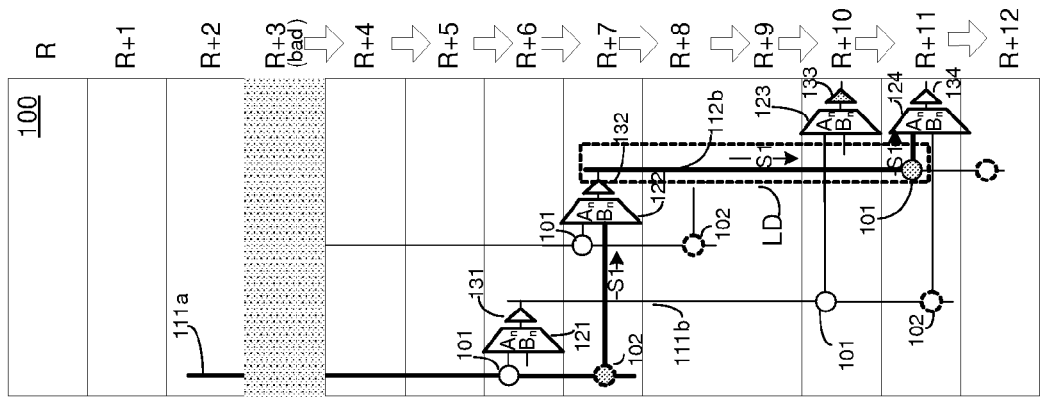
FIGS. 1a-1c illustrate routing from downstream vertical lines for selected rows in a portion 100 of a PLD operating in normal (FIG. 1a) and redundant (FIGS. 1b-1c) modes in accordance with an embodiment of the present invention.
Figure 1B:
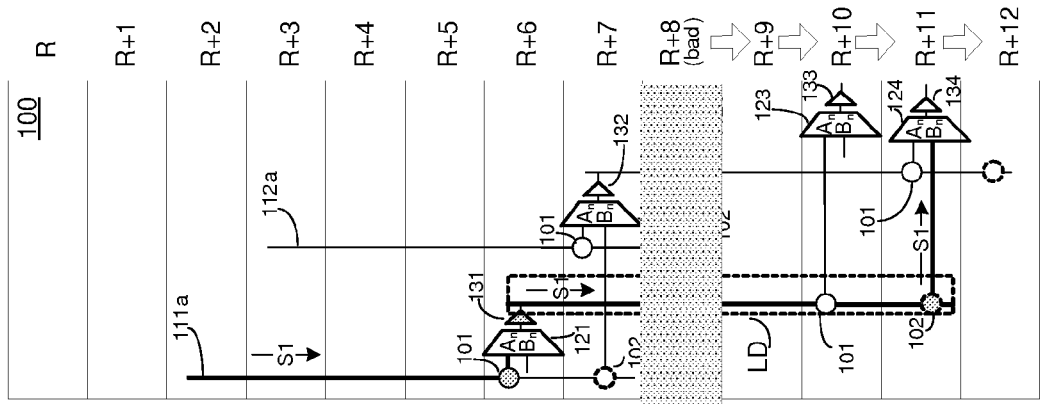
Figure 1A:
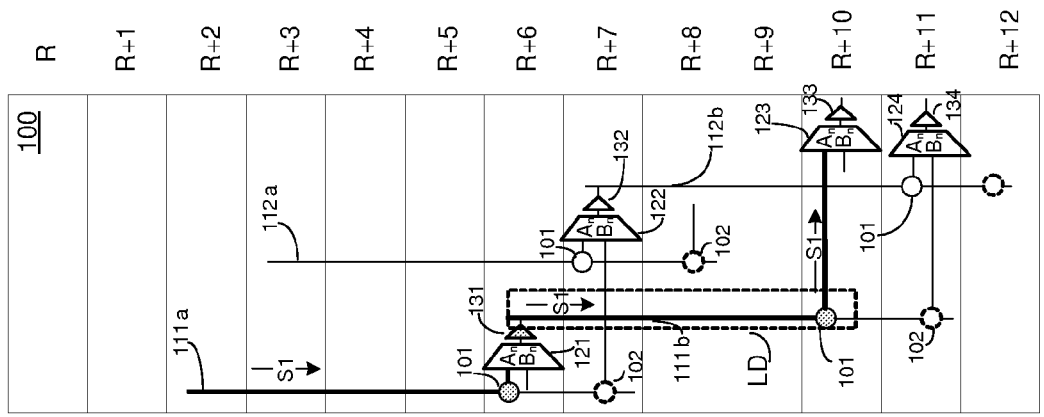

FIGS. 1a-1c illustrate routing from downstream vertical lines for selected rows in a portion 100 of a PLD operating in normal (FIG. 1a) and redundant (FIGS. 1b-1c) modes in accordance with an embodiment of the present invention. "Downstream" simply refers to the fact connections from these lines are located downstream from the line driver where downstream is determined relative to a redundancy row-shifting direction (irrespective of whether the redundancy row shifting is presently engaged).

Referring to FIG. 1a, PLD portion 100 includes vertical lines 111a, 111b, 112a, and 112b; multiplexers ("muxes") 121, 122, 123, and 124; drivers 131, 132, 133, and 134; connections 101; and connections 102. The PLD portion 100 illustrated includes thirteen rows (labeled R to R+12) of a logic array of the PLD that includes portion 100. The term "array" in this context simply refers to the fact that at least some of the PLD circuitry may be viewed as associated with one of multiple rows.

In the presently illustrated embodiment, connections 101 and 102 are not field programmable. As will be explained further below, programming of muxes to select particular inputs is used to implement a particular choice of routing paths. However, in alternative embodiments, connection vias that are similar to connections 101 and 102 but that are field programmable may be used without necessarily departing from the spirit and scope of the present invention. "Routing connections" as referred to herein may refer to any one of a number of types of elements—or element inputs—including connections such as connections 101 and 102, inputs to routing elements such as muxes 121-124, or inputs to other routing elements.

As illustrated in FIG. 1a, a logical line "LD" is, in a normal mode of PLD portion 100, implemented on first vertical line 111b to provide a signal pathway to driver 133 through the $A_n$ input of mux 123. The term "logical line" is used to refer to a particular set of connectivity characteristics that are available from the perspective of a PLD's user (one example of a PLD user might be a person or computer that is using the PLD to design or provide a signal processing system). A logical line provides connectivity of a certain logical length or lengths as measured in usable rows. For example, in FIG. 1a, logical line "LD" is implemented on vertical line 111b and provides connectivity from driver 131 in row R+6 to driver 133 in row R+10 via a connection 101 and the $A_n$ input of routing input mux 123. This connectivity may be referred to as having a logical length four, that is to say, four usable rows away from the row in which the line is driven. FIG. 1a further illustrates, by way of example, a signal S1 whose routing path includes logical line LD.

In particular embodiments, muxes such as muxes 123 and 124 may select inputs for a LAB, an LE, a horizontal routing line, another vertical routing line (V-line), an IO BUS line or other circuitry. For purposes herein, such muxes will occasionally be referred to as routing input muxes.

Referring to FIG. 1b, the same PLD portion 100 of FIG. 1a is illustrated, except that row R+8 in the FIG. 1b illustration is bad. Thus, the redundancy scheme is invoked to shift rows below row R+7 to repair the PLD in light of the defect to row R+8. The rows illustrated that are shifted may be referred to as operating in a redundant mode.

It will be understood by those skilled in the art that a row such as row R+8 in FIG. 1b may be considered to be "defective" due to a defect that is physically located in the same row or in another row. For example, a vertical line somewhere other than the illustrated portion 100 might be driven from row R+8 but have a short or open on that line in row R+11. This defect will cause row R+8 to be considered "bad" as the defective line is driven from that row (R+8) and a row-shifting redundancy scheme might be able to repair the PLD by treating row R+8 as bad and shifting rows accordingly. Thus, it will be understood that when a row is referred to herein as having a "defect," it will mean that the row is considered bad from the perspective of repairing the device, whether or not the physical location of the defect is in the row that is designated as bad.

Continuing with FIG. 1b, a spare row exists below row R+8, but is not separately shown. Routing connections are shifted down from row R+8 to the spare row to effect the repair. In this manner, within a repairable region defined above a spare row, a number of "redundant mode" rows (e.g. rows R+9, R+10, R11, etc.) are utilized in a redundant mode in the same manner as a number of corresponding "normal mode" rows (e.g. rows R+8, R+9, R+10, etc.) would have been used in a normal mode. Row shifting begins in rows spanned by first vertical line 111b, but below the row corresponding to that line's driver 131.

In this example, logical line LD is still implemented on first vertical line 111b, however its connectivity is implemented via a connection 102 to the $B_n$ input of mux 124 associated with row R+11. Although, in this FIG. 1b example, the physical length of the connection implemented on conductor 111b is extended by one row, the logical length remains constant at length four. Because row R+8 is bad, it is not counted in the logical length. To enhance illustration of the example, the path for routing signal S1 is again highlighted, here showing a redundant mode routing path.

Referring to FIG. 1c, the same PLD portion 100 of FIGS. 1a-1b is illustrated, except that row R+3 in the FIG. 1c illustration is bad. Thus, the redundancy scheme is invoked to shift rows below row R+2 to repair the PLD in light of the defect in row R+3. The row shifting begins in rows above the driver 131 of first vertical line 111b and continues in the other illustrated rows occupied by lines 111b and 112b.

In this example, row shifting includes the row from which first vertical line 111a is driven and logical line LD is shifted to second vertical line 112b. Here logical line LD provides connectivity from driver 132 in row R+7 to driver 134 in row R+11 via a connection 101 and the $A_n$ input of routing input mux 124. The path of signal S1 in this example is highlighted. As shown, the selective wire shift is accomplished by enabling the $B_n$ input of mux 122 so that line 111a has connectivity to line 112b via a connection 102, mux 122, and driver 132. The logical length of line LD's connectivity is again four, with no unusable rows between line 112b's drive point in row R+7 and routing connection in row R+11.

As used herein, terms such as "A" input and "B" input and similar such terms are merely labels used to distinguish one input from another. Similarly, terms such as "first" vertical line, "second" vertical line, "first" row, and "second" row are simply labels used merely to distinguish one vertical line (or row) from another.

Figure 2C:
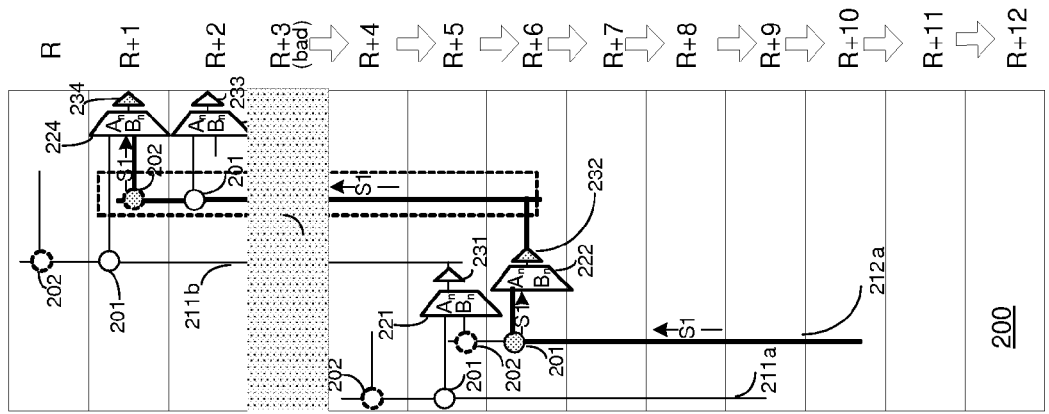
FIGS. 2a-2c illustrate routing from upstream vertical lines for selected rows in a portion 200 of a PLD operating in normal (FIG. 2a) and redundant (FIGS. 2b-2c) modes in accordance with an embodiment of the present invention.
Figure 2B:
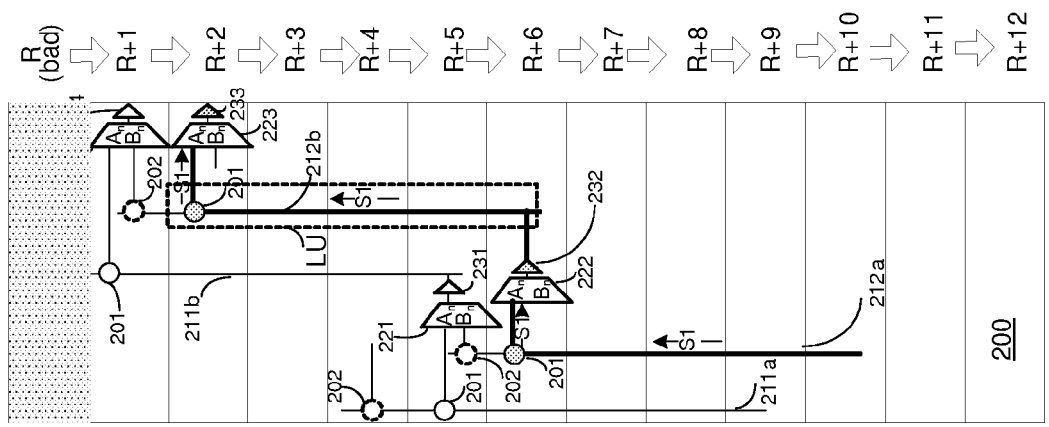
Figure 2A:
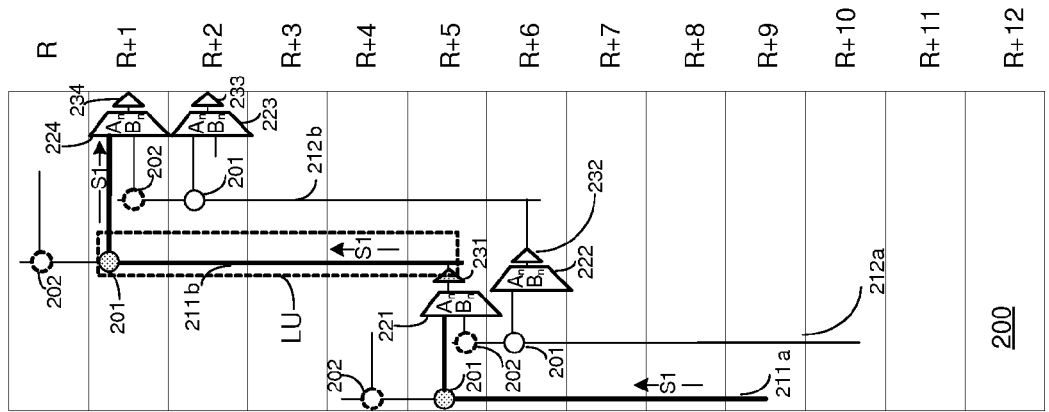

FIGS. 2a-2c illustrate routing from upstream vertical lines for selected rows in a portion 200 of a PLD operating in normal (FIG. 2a) and redundant (FIGS. 2b-2c) modes in accordance with an embodiment of the present invention. "Upstream" simply refers to the fact that connections from these lines are located upstream from the line driver where upstream is determined relative to a redundancy row-shifting direction (irrespective of whether the redundancy row shifting is presently engaged).

Referring to FIG. 2a, PLD portion 200 includes vertical lines 211a, 211b, 212a, and 212b; muxes 221, 222, 223, and 224; drivers 231, 232, 233, and 234; connections 201; and connections 202. The PLD portion 200 illustrated includes thirteen rows (labeled R to R+12) of a logic array of the PLD that includes portion 200.

As illustrated in FIG. 2a, a logical line "LU" is, in a normal mode of PLD portion 200, implemented on first vertical line 211b to provide a signal pathway to driver 234 through the $A_n$ input of mux 224 in row R+1. This connectivity is logical length four as measured from line LU's drive point in row R+5. FIG. 2a further illustrates, by way of example, a signal S1 whose routing path includes logical line LU.

Referring to FIG. 2b, the same PLD portion 200 of FIG. 2a is illustrated, except that row R in the FIG. 2b illustration is bad. Thus, the redundancy scheme is invoked to shift row R and the rows below row R to repair the PLD in light of the defect in row R. A spare row exists below row R, but is not separately shown. Routing connections are shifted down from row R to the spare row to effect the repair.

In this example, logical line LU is shifted to second vertical line 212b. Here logical line LU provides connectivity from driver 232 in row R+6 to driver 233 in row R+2 via a connection 201 and the A'' input of routing input mux 223. The path of signal S1 this example is highlighted. As shown, the selective wire shift has also occurred from vertical line 211a to vertical line 212a, though the drivers and driver input muxes for those conductors are not separately shown. Thus, with the wire shift, signal S1 travels from conductor 212a to 212b via a connection 201 and the $A_n$ input of mux 222 in row R+6. The logical length of line LU's connectivity is again four, with no unusable rows between line 212b's drive point in row R+6 and routing connection point in row R+2.

Referring to FIG. 2c, the same PLD portion 200 of FIGS. 2a-2b is illustrated, except that row R+3 in the FIG. 2c illustration is bad. Thus, the redundancy scheme is invoked to shift rows below row R+2 to repair the PLD in light of the defect in row R+3. The row shifting begins in rows above the driver 231 of first vertical line 211b and continues in the other illustrated rows occupied by conductors 211a and 212a. Also, the bad row, row R+3, is between the relevant driving and connection points.

In this example, logical line LU is again shifted to second vertical line 212b. Here logical line LU provides connectivity from driver 232 in row R+6 to driver 234 in row R+1 via a connection 202 and the $B_n$ input of routing input mux 224. The path of signal S1 in this example is highlighted. Although connectivity for line LU is from row R+6 to row R+1, the logical length of LU is again four because bad row R+3 is not counted in measuring logical length.

FIGS. 3a-3c illustrate routing from downstream vertical lines for selected rows in a portion 300 of a PLD operating in normal (FIG. 3a) and redundant (FIGS. 3b-3c) modes in accordance with an embodiment of the present invention. The lines shown in FIGS. 3a-3c cross a spare row, row R+5.

Referring to FIG. 3a, PLD portion 300 includes vertical lines 311, 312, and 313; drivers 331, 332, and 333; connections 301; and connections 302. In order to avoid over complicating the drawings, routing input muxes are not separately shown. However, it is understood that a connection 301 is a connection to the $A_n$ input of a routing input mux associated with the row corresponding to the particular 301 connection and a connection 302 is a connection to the $B_n$ input of a routing input mux associated with the row corresponding to the particular 302 connection. The PLD portion 300 illustrated includes thirteen rows (labeled R to R+12) of a logic array of the PLD that includes portion 300.

As illustrated in FIG. 3a, two logical lines LD1 and LD2 are, in a normal mode of PLD portion 300, implemented on respective first vertical lines 311 and 312. Line 311 is driven from row R+3 and, as illustrated, the activated connections to routing input muxes are in row R+4 (via a connection 301 to the $A_n$ input of a row R+4 routing input mux) and row R+8 (via a connection 302 to the $B_n$ input of a row R+8 routing input mux). In the normal mode illustrated in FIG. 3a, spare row R+5 is not used (as no repair is needed) and thus is not counted in measuring logical length. Thus the logical connectivity lengths provided on line LD1 relative to the driver row (R+3) are one and four. In other words, logical line LD1 provides connections that are one and four useable rows from the driver row. Line LD2 has similar connectivity characteristics but in different rows as implemented on vertical line 312. Line 312 is driven from row R+4 and, as illustrated, the activated connections to routing input muxes are in row R+6 (via a connection 302 to the $B_n$ input of a row R+6 routing input mux) and row R+9 (via a connection 302 to the $B_n$ input of a row R+9 routing input mux). Thus the connectivity lengths provided on line LD2 are also one and four (with row R+5 not being used and thus not being counted). Signal paths are highlighted to show connectivity provided by LD1 and LD2 in a normal mode for exemplary signals S1 and S2.

Referring to FIG. 3b, the same PLD portion 300 of FIG. 3a is illustrated, except that rows R+4 and R+9 in the FIG. 3b illustration are bad. A first repairable region is defined above spare row R+5. Another spare row exists but is not separately shown below spare row R+5. Thus a second repairable region is defined below spare row R+5 and above the unshown spare row. Thus, the redundancy scheme is invoked to shift row R+4 and the rows below row R+8 to repair the PLD in light of the defects to rows R+4 and row R+9.

Logical line LD1 is implemented on the same vertical line 311. However, because row R+4 is now considered bad and row R+5 is now activated, the line 311 connection in row R+4 shifts to row R+5 via a connection 302 to the $B_n$ input of a row R+5 mux (row R+5 active in redundant mode). Line LD1 thus still has connectivity of one and four logical lengths (measured in useable rows) away from the row R+3 driver.

Logical line LD2 shifts to vertical line 313 driven by driver 333 in row R+5. Vertical line 313 provides connectivity to row R+6 via a connection 301 to the $A_n$ input of a row R+6 mux and to row R+10 via a connection 302 to the $B_n$ input of a row R+10 mux. Because bad row R+9 is not used, the connectivity lengths relative to the line LD2's driver are still one and four.

Signal paths are highlighted to show connectivity provided by LD1 and LD2 in the FIG. 3b redundant mode for exemplary signals S1 and S2.

Referring to FIG. 3c, the same PLD portion 300 of FIGS. 3a-3b is illustrated, except that rows R+1 and R+9 in the FIG. 3c illustration are bad. Thus, the redundancy scheme is invoked to shift rows R+1, R+2, R+3, and R+4 and also to shift the rows below row R+8 to repair the PLD in light of the defects in rows R+1 and row R+9.

Logical lines LD1 and LD2 shift to respective second vertical lines 312 and 313. Logical line LD1 as implemented on second vertical line 312 provides connectivity to spare row R+5 (active in redundant mode) via a connection 301 to the $A_n$ input of a row R+5 mux and to row R+8 via another connection 301 to the $A_n$ input of a row R+8 mux. Line LD1 thus still has connectivity of one and four logical lengths away from the line's drive point which, in this redundant mode, is in row R+4.

Logical line LD2 as implemented on second vertical line 313 provides connectivity to row R+6 via a connection 301 to the $A_n$ input of a row R+6 mux and to row R+10 via a connection 302 to the $B_n$ input of a row R+10 mux. Because bad row R+9 is not used, the connectivity lengths relative to the row from which the line is driven (row R+5 in this redundant mode) are still one and four.

Signal paths are highlighted to show connectivity provided by LD1 and LD2 in the FIG. 3c redundant mode for exemplary signals S1 and S2.

FIGS. 4a-4c illustrate routing from upstream vertical lines for selected rows in a portion 400 of a PLD operating in normal (FIG. 4a) and redundant (FIGS. 4b-4c) modes in accordance with an embodiment of the present invention. The lines shown in FIGS. 4a-4c cross a spare row, row R+5.

Referring to FIG. 4a, PLD portion 400 includes vertical lines 411, 412, and 413; drivers 431, 432, and 433; connections 401; and connections 402. In order to avoid over complicating the drawings, routing input muxes are not separately shown. However, it is understood that a connection 401 is a connection to the $A_n$ input of a routing input mux associated with the row corresponding to the particular 401 connection and a connection 402 is a connection to the $B_n$ input of a routing input mux associated with the row corresponding to the particular 402 connection. The PLD portion 400 illustrated includes thirteen rows (labeled R to R+12) of a logic array of the PLD that includes portion 400.

As illustrated in FIG. 4a, two logical lines LU1 and LU2 are, in a normal mode of PLD portion 400, implemented on respective first vertical lines 411 and 412. Line 411 is driven from row R+7 and, as illustrated, the activated connections to routing input muxes are in row R+6 (via a connection 401 to the $A_n$ input of a row R+6 routing input mux) and row R+2 (via a connection 402 to the $B_n$ input of a row R+2 routing input mux). In the normal mode illustrated in FIG. 4a, spare row R+5 is not used (as no repair to other rows is needed) and thus is not counted in measuring logical length. Thus the logical connectivity lengths provided on line LU1 relative to the driver row (R+7) are one and four. Line LU2 has similar connectivity characteristics but in different rows. Line LU2 is, in normal mode, implemented on vertical line 412. Line 412 is driven from row R+8 and, as illustrated, the activated connections to routing input muxes are in rows R+7 (via a connection 401 to the $A_n$ input of a row R+7 routing input mux) and R+3 (via a connection 402 to the $B_n$ input of a row R+3 routing input mux). Thus the connectivity lengths provided on line LU2 are also one and four (with row R+5 not being used and thus not being counted). Signal paths are highlighted to show connectivity provided by LU1 and LU2 in a normal mode for exemplary signals S1 and S2.

Referring to FIG. 4b, the same PLD portion 400 of FIG. 4a is illustrated, except that row R+3 in the FIG. 4b illustration is bad. A repairable region is defined above spare row R+5. Thus, the redundancy scheme is invoked to shift rows R+3 and R+4 to repair the PLD in light of the defect in rows R+3.

Logical line LU1 is implemented on the same vertical line 411. Conductor 411's connection patterns also remain the same and connectivity is provided to routing input muxes in row R+6 (via a connection 401 to the $A_n$ input of a row R+6 routing input mux) and row R+2 (via a connection 402 to the $B_n$ input of a row R+2 routing input mux). Spare row R+5 is now utilized and thus counted in measuring logical length; however, row R+3 is now bad and is not counted in measuring logical length. Thus, line LU1 still has connectivity of one and four logical lengths (measured in useable rows) away from the row R+7 driver.

Logical line LU2 is still implemented on the same vertical line 412. However, the line 412 connection in bad row R+3 shifts to row R+4 via a connection 301 to the $A_n$ input of a row R+4 routing input mux. As spare row R+5 is now activated and counted in measuring logical length, line LU2 still provides connectivity of one and four logical lengths away from the row R+8 driver.

Signal paths are highlighted to show connectivity provided by LU1 and LU2 in the FIG. 4b redundant mode for exemplary signals S1 and S2.

Referring to FIG. 4c, the same PLD portion 400 of FIGS. 4a-4b is illustrated, except that rows R+1 and R+8 in the FIG. 4c illustration are bad. A first repairable region is defined above spare row R+5. Another spare row exists but is not separately shown below spare row R+5. Thus, a second repairable region is defined below spare row R+5. As illustrated, the redundancy scheme is invoked to shift rows R+1, R+2, R+3, and R+4 and also rows below row R+7 to repair the PLD in light of the defects in rows R+1 and R+8.

Logical line LU1 is still implemented on the same vertical line 411. However, the line 411 connection in row R+2 shifts to row R+3 via a connection 301 to the $A_n$ input of a row R+3 routing input mux. As spare row R+5 is now activated and counted in measuring logical length, line LU1 still provides connectivity of one and four logical lengths away from the row R+7 driver.

Logical line LU2 shifts to vertical line 413. Line LU2, as implemented on second vertical line 413, provides connectivity to row R+7 via a connection 402 to the $B_n$ input of a row R+7 mux and to row R+4 via a connection 402 to the $B_n$ input of a row R+4 mux. Row R+5 is now utilized and counted in measuring logical length while bad row R+8 is not. Thus, the connectivity lengths relative to the row from which the logical line is driven (row R+9 in this redundant mode) are still one and four.

Signal paths are highlighted to show connectivity provided by LU1 and LU2 in the FIG. 4c redundant mode for exemplary signals S1 and S2.

Figure 5C:
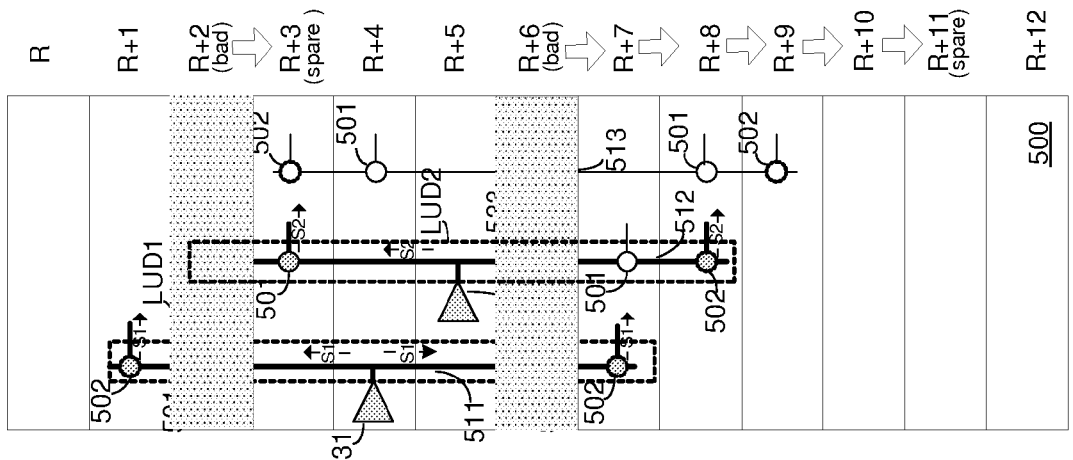
FIGS. 5a-5c illustrate routing from vertical lines that provide both upstream and downstream connectivity for selected rows in a portion 500 of a PLD operating in normal (FIG. 5a) and redundant (FIGS. 5b-5c) modes in accordance with an embodiment of the present invention.
Figure 5B:
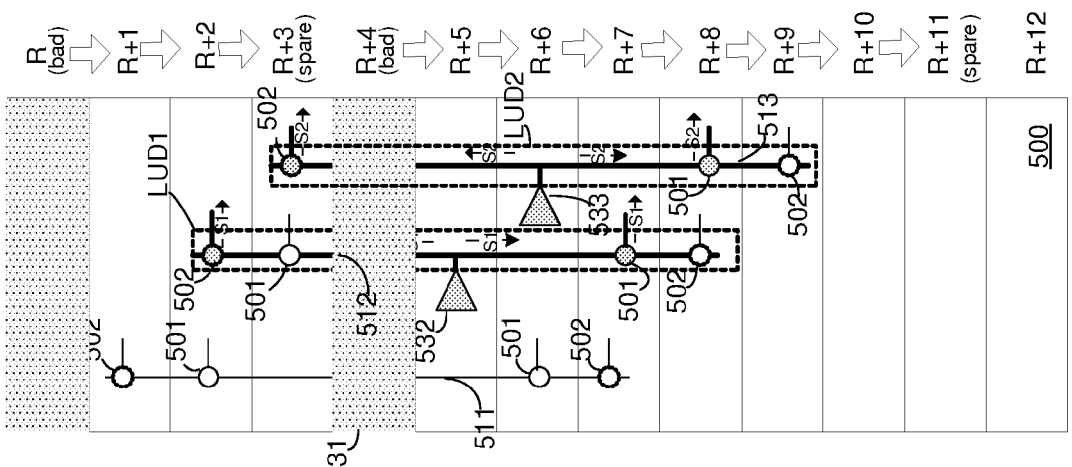
Figure 5A:
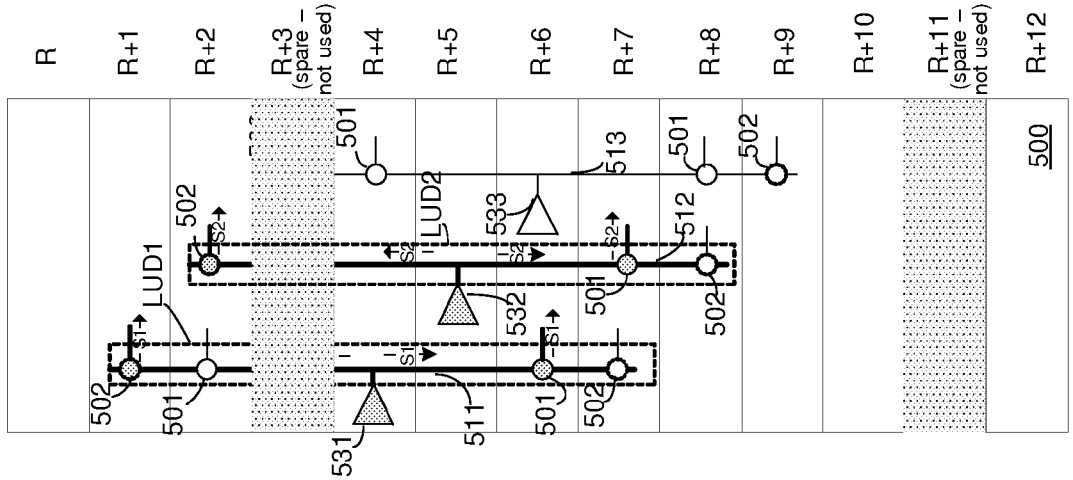

FIGS. 5a-5c illustrate routing from vertical lines that provide both upstream and downstream connectivity for selected rows in a portion 500 of a PLD operating in normal (FIG. 5a) and redundant (FIGS. 5b-5c) modes in accordance with an embodiment of the present invention. The lines shown in FIGS. 5a-5c cross or end in a spare row, row R+3. Another spare row exists in row R+11.

Referring to FIG. 5a, PLD portion 500 includes vertical lines 511, 512, and 513; drivers 531, 532, and 533; connections 501; and connections 502. In order to avoid over complicating the drawings, routing input muxes are not separately shown. However, it is understood that a connection 501 is a connection to the $A_n$ input of a routing input mux associated with the row corresponding to the particular 501 connection and a connection 502 is a connection to the $B_n$ input of a routing input mux associated with the row corresponding to the particular 502 connection. The PLD portion 500 illustrated includes thirteen rows (labeled R to R+12) of a logic array of the PLD that includes portion 500.

As illustrated in FIG. 5a, two logical lines LUD1 and LUD2 are, in a normal mode of PLD portion 500, implemented on respective first vertical lines 511 and 512. Line 511 is driven from row R+4 and, as illustrated, the activated connections to routing input muxes are in row R+1 (via a connection 502 to the $B_n$ input of a row R+1 routing input mux) and row R+6 (via a connection 501 to the $A_n$ input of a row R+6 routing input mux). In the normal mode illustrated in FIG. 5a, spare rows R+3 are R+1 are not used (as no repair to other rows is needed) and thus not counted in measuring logical length. Thus the logical connectivity lengths provided on line LUD1 relative to the driver row (R+4) are two upstream (to row R+1) and two downstream (to row R+6). Line LUD2 has similar connectivity characteristics but in different rows. Line LUD2 is, in normal mode, implemented on vertical line 512. Line 512 is driven from row R+5 and, as illustrated, the activated connections to routing input muxes are in rows R+2 (via a connection 502 to the $B_n$ input of a row R+2 routing input mux) and R+7 (via a connection 501 to the $A_n$ input of a row R+7 routing input mux). Thus the connectivity lengths provided on line LUD2 are also two upstream (to row R+2) and two downstream (to row R+7). Signal paths are highlighted to show connectivity provided by LUD1 and LUD2 in a normal mode for exemplary signals S1 and S2.

Referring to FIG. 5b, the same PLD portion 500 of FIG. 5a is illustrated, except that rows R and R+4 in the FIG. 5b illustration are bad. A first repairable region is defined above spare row R+3 and a second repairable region is defined above row R+11 (and below row R+3). Thus, the redundancy scheme is invoked to shift rows R, R+1, and R+2 and rows R+4, R+5, R+6, R+7, R+8, R+9, and R+10 to repair the PLD in light of the defects to rows R and R+4.

Logical lines LUD1 and LUD2 shift to respective second vertical lines 512 and 513. Line LUD1, as implemented on second vertical line 512, provides upstream connectivity to row R+2 via a connection 502 to the $B_n$ input of a row R+2 mux and downstream connectivity to row R+7 via a connection 501 to the $A_n$ input of a row R+7 mux. Row R+3 (and R+11) is now utilized and counted in measuring logical length while bad rows R and R+4 are not. Thus, the connectivity lengths relative to the row from which the logical line is driven (row R+5 in this redundant mode) are still two upstream (to row R+2) and two downstream (to row R+7).

Line LUD2, as implemented on second vertical line 513, provides upstream connectivity to row R+3 via a connection 502 to the $B_n$ input of a row R+3 mux and downstream connectivity to row R+8 via a connection 501 to the $A_n$ input of a row R+8 mux. Row R+3 (and R+11) is now utilized and counted in measuring logical length while bad rows R and R+4 are not. Thus, the connectivity lengths relative to the row from which the logical line is driven (row R+6 in this redundant mode) are still two upstream (to row R+3) and two downstream (to row R+8).

Signal paths are highlighted to show connectivity provided by LUD1 and LUD2 in the FIG. 5b redundant mode for exemplary signals S1 and S2.

Referring to FIG. 5c, the same PLD portion 500 of FIGS. 5a-5b is illustrated, except that rows R+2 and R+6 in the FIG. 5c illustration are bad. As illustrated, the redundancy scheme is invoked to shift row R+2 and also rows R+6, R+7, R+8, R+9, and R+10 to repair the PLD in light of the defects to rows R+2 and R+6.

Logical line LUD1 is still implemented on the same vertical line 511. However, the line 511 connection in row R+6 shifts to row R+7 via a connection 502 to the $B_n$ input of a row R+7 routing input mux. As spare row R+3 (and R+11) is now activated and counted in measuring logical length, line LUD1 still provides connectivity of two upstream (to row R+1) and two downstream (to row R+7) logical lengths away from the row R+4 driver.

Logical line LUD2 is still implemented on the same vertical line 512. However, the line 512 connection in row R+2 shifts to row R+3 via a connection 501 to the $A_n$ input of a row R+3 routing input mux. Also, the line 512 connection in row R+7 shifts to row R+8 via a connection 502 to the $B_n$ input of a row R+8 routing input mux. Logical line LUD2 still provides connectivity of two upstream (to row R+3) and two downstream (to row R+8) logical lengths away from the row R+5 driver.

Signal paths are highlighted to show connectivity provided by LU1 and LU2 in the FIG. 5c redundant mode for exemplary signals S1 and S2.

The vertical lines illustrated in FIGS. 1a-2c are utilized to provide connectivity at a logical length of four useable rows from the driver (1a-1c downstream, 2a-2c upstream). Those in FIGS. 3a-4c are utilized to provide connectivity at logical lengths of one and four useable rows from the driver (3a-3c downstream, 4a-4c upstream). Those in FIGS. 5a-5c are utilized to provide connectivity at logical lengths of two upstream and two downstream relative to the driver.

The lines in FIGS. 1a-5c may all be referred to as "V4" lines indicating that the logical length of the line is four. In this context, "logical length" may be understood as a sum of a line's upstream logical length and downstream logical length. Upstream logical length may be understood as the number of useable rows from the line's driver (but not counting the driver row) to the furthest useable upstream connection. Similarly, downstream logical length may be understood as the number of useable rows from the line's driver (but not counting the driver row) to the furthest useable downstream connection. Downstream logical length plus upstream logical length reflects a total logical length. For example, the V-lines in FIGS. 1a-1c and 3a-3c provide, in a particular mode, a maximum downstream connectivity of four and no upstream connectivity, and thus have a downstream logical length of four. Those in FIGS. 2a-2c and 4a-4c provide, in a particular mode, maximum upstream connectivity of four and no downstream connectivity and thus have an upstream logical length of four. Those in FIGS. 5a-5c provide, in a particular mode, a maximum upstream connectivity of two and a maximum downstream connectivity of two, and thus have an upstream logical length of two, a downstream logical length of two, and a total logical length of four.

The referenced V4 lines have a physical length greater than this logical length. The V-lines in FIGS. 1a-4c have physical lengths of five physical rows and those in FIGS. 5a-5c have physical lengths of six physical rows. In the context of the purely upstream or downstream lines illustrated in FIGS. 1a-4c, the portion of the line connectable in either the fifth row downstream from the line's driver (FIGS. 1a-1c and 3a-3c) or the fifth row upstream from the line's driver (FIGS. 2a-2c and 4a-4c) may be referred to as an "extended" portion. In the context of the V-lines of FIGS. 5a-5c, which provide both downstream and upstream connectivity, the portion of the line connectable in the third row downstream and also the portion in the third row upstream from the line's driver may similarly be referred to as extended portions (in this sense, the V-lines of FIGS. 5a-5c have two extended portions, one on the downstream end and one on the upstream end). "Extended" in this context simply refers to a portion of the line that may be used to extend a physical length of the longest length connection for purposes of maintaining a consistent logical length. Thus, in various examples that have been illustrated and described, the "extended" portion of the line is utilized when the line is crossing a row designated as "bad" (e.g. either a spare row not used in normal mode or a defective row not used in redundant mode).

One skilled in the art will appreciate that the inventive redundancy scheme illustrated herein may be implemented on vertical line networks of lengths different than that shown and having drive points different than those shown. For example, the scheme might be implemented on vertical lines that have a significantly greater length and that connect to a significantly greater number of rows.

Figure 6B:
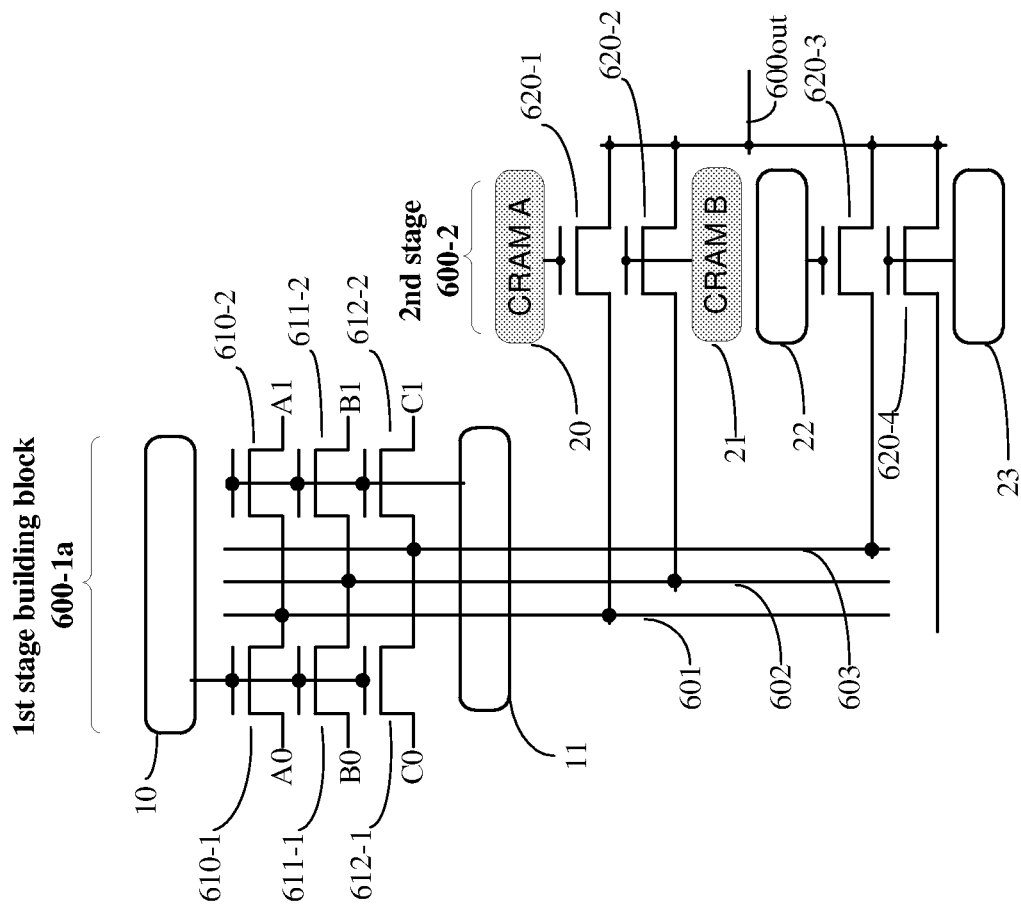
FIGS. 6a-6b illustrate a routing input multiplexer ("mux") 600 with inputs and configuration elements arranged to facilitate implementation of the routing redundancy scheme illustrated in FIGS. 1a-5c.
Figure 6A:
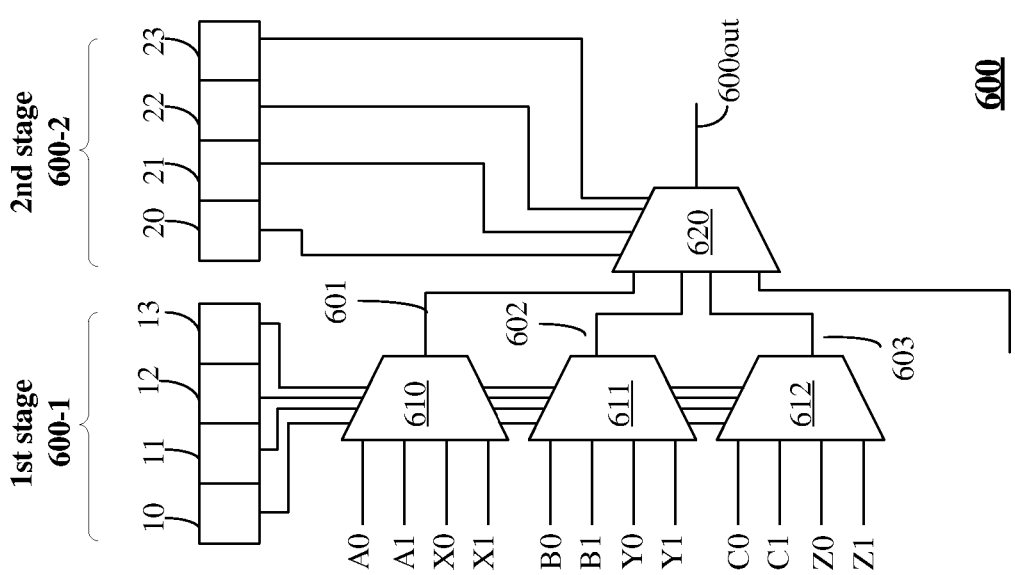

FIGS. 6a-6b illustrate a routing input multiplexer ("mux") 600 with inputs and configuration elements arranged to facilitate implementation of the routing redundancy scheme illustrated in FIGS. 1a-5c. Referring to FIGS. 1a-5c, those skilled in the art will appreciated that the various routing paths illustrated from vertical lines to routing input muxes may be selected based on the programming of those routing input muxes to select particular inputs. For example, referring to FIGS. 1a and 1c, the FIG. 1a path for signal S1 (including logical line LD) is implemented by programming mux 121 to select its $A_n$ input and programming mux 123 to select its $A_n$ input while the FIG. 1c path for signal S1 (also including logical line LD) is implemented by programming mux 122 to select its $B_n$ input and programming mux 124 to select its $A_n$ input. As a further example, referring to FIGS. 3a and 3c, the FIG. 3a path for signal S2 (including logical line LD2) is implemented by programming a row R+6 routing input mux coupled to line 312 via a connection 302 to select its $B_n$ input and a row R+9 routing input mux coupled to line 312 via a connection 302 to select its $B_n$ input (routing input muxes not separately shown), and the FIG. 3c path for signal S2 (also including logical line LD2) is implemented by programming a row R+6 routing input mux coupled to line 313 via a connection 301 to select its $A_n$ input and programming a row R+10 routing input mux coupled to line 313 via a connection 302 to select its $B_n$ input (routing input muxes not separately shown).

Referring to FIG. 6a, an exemplary routing input mux 600 is shown. Routing input mux 600 illustrates merely one possible example of a routing input mux that might be used in conjunction with an embodiment of the present invention. One skilled in the art will appreciate that muxes such as those referenced in describing FIGS. 1a-5c (for example, muxes 123 and 124 in FIGS. 1a-1c) may, in particular context, be understood as simply representing two of several inputs within a larger routing input mux such as mux 600 of FIG. 6a.

Continuing with FIG. 6a, mux 600 includes a first stage 600-1 and a second stage 600-2. First stage 600-1 includes configuration elements 10, 11, 12, and 13 and first stage muxes 610, 611, and 612. Configuration elements 10, 11, 12, and 13 are coupled to the control inputs of muxes 610, 611, and 612 as shown. First stage muxes 610, 611, and 612 are coupled to receive signals through various inputs. First stage mux 610 is coupled to receive inputs A0, A1, X0, and X1; first stage mux 611 is coupled to receive inputs B0, B1, Y0, and Y1; first stage mux 612 is coupled to receive inputs C0, C1, Z0, and Z1. Second stage 600-2 includes configuration elements 20, 21, 22, and 23 and second stage mux 620. Configuration elements 20, 21, 22, and 23 are coupled to control inputs of mux 620 as shown. Second stage mux 620 is coupled as shown to receive input from the outputs of first stage muxes 610, 611, and 612 via respective mux lines 601, 602, and 603. The output of second stage mux 620 provides output for mux 600 at output 600out.

FIG. 6b illustrates a portion of mux 600 of FIG. 6a in further detail. In particular, FIG. 6b illustrates first stage building block 600-1a and further details of second stage 600-2.

First stage building block 600-1a includes transistor pass gates 610-1, 610-2, 611-1, 611-2, 612-1, and 612-2. These transistor pass gates are respectively coupled as shown to inputs A0, A1, B0, B1, C0, and C1. Pass gates 610-1 and 610-2 are coupled to mux line 601, pass gates 611-1 and 611-2 are coupled to mux line 602, and pass gates 612-1 and 612-2 are coupled to mux line 603. Pass gates 610-1, 611-1, and 612-1 are all coupled to configuration element 10 and pass gates 610-2, 611-2, and 612-2 are all coupled to configuration element 11. Those skilled in the art will understand that first stage 600-1 would also include another similar first stage building block relating the other inputs (X0, X1, Y0, Y1, Z0, Z1) to the other configuration elements (12 and 13). That other building block is not separately shown.

Second stage 600-2 includes transistor pass gates 620-1, 620-2, 620-3, and 620-4 which are coupled to, respectively, configuration elements 20, 21, 22, and 23. Pass gates 620-1, 620-2, and 620-3 are also respectively coupled to mux lines 601, 602, and 603. Configuration elements 20 and 21 are respectively labeled "CRAM A" and "CRAM B." The term "CRAM" stands for "configuration random access memory" which simply refers to the fact that in a particular embodiment, configuration elements may be implemented as RAM cells. However, as discussed in the background section, configuration elements may be also be implemented by other means.

In the present example illustrated in FIGS. 6a-6b, it is understood that inputs A0, B0, A1, and B1 can be coupled to receive signals from vertical routing lines associated with a specified redundancy scheme consistent with the present invention such as, for example, the vertical lines illustrated in FIGS. 1a-5c. In FIGS. 1a-5c, each routing input mux illustrated receives signals from two vertical lines at a pair of inputs $A_n$ and $B_n$. Mux 600 is adapted to receive signals from up to four such vertical lines at two pairs of inputs: A0, B0 and A1, B1. It is understood that other inputs to mux 600 (e.g. C0, C1, Y0, Y1, Z0, Z1) are used to receive signals from other routing resources (e.g. horizontal lines, LE outputs, etc., or other vertical lines not incorporated into the same redundancy scheme; such "other vertical lines" may, in some contexts, include vertical lines associated with another redundancy scheme).

The programming of configuration elements 10 and 11 determines whether respective mux lines 601, 602, 603 receive signals from: (i) respective inputs A0, B0, C0; (ii) respective inputs A1, B1, C1; or (iii) neither (i) nor (ii). The programming of configuration elements 20 and 21 determine whether output 600out receives signals from: (i) mux line 601; (ii) mux line 602; or (iii) neither (i) nor (ii). Thus, for example, assuming signals A0, B0, and C0 have been selected in first stage 600-1 to be provided on mux lines 601, 602, and 603, and further assuming that configuration elements 22 and 23 are set to "0" (so that output from transistors 620-3 and 620-4 is not provided to output 600out), the programming of configuration element 20 ("CRAM A") and configuration element 21 ("CRAM B") determines the selection between inputs A0 and B0 for providing output to 600out.

In one aspect of the present embodiment, the arrangement of mux 600 and its associated inputs allows the selection between an $A_n$ and $B_n$ input (e.g. between either inputs A0 and B0 or inputs A1 and B1 of mux 600) to be dependent upon the programming of two configuration elements (e.g. 20 and 21 labeled "CRAM A" and "CRAM B"). This allows a selection between a mux $A_n$ and $B_n$ input to be "flipped" by "flipping," i.e. exchanging, two configuration bits (e.g. exchanging the configuration bit to be held in CRAM A with the configuration bit to be held in CRAM B). In another aspect, those two configuration elements (e.g. CRAM A and CRAM B) are provided in the same frame of configuration elements. In other words, as illustrated in FIG. 6b, CRAM A and CRAM B are in the same vertical span of configuration elements (e.g. elements 20, 21, 22, and 23 are all in the same frame). As will be explained further below in the context of FIG. 8, a programmable logic device may be programmed on a frame-by-frame basis, where a "frame" refers to a vertical span of configuration elements or may also refer to the data loaded into that vertical span of configuration elements. In yet another aspect, those two configuration elements are consecutive. In other words, as illustrated in FIG. 6b, there are no other configuration elements between CRAM A and CRAM B in the same frame of configuration elements.

As they have been described above, FIGS. 6a-6b illustrate what might be termed "second stage" redundancy protection. In other words, the redundancy scheme illustrated in FIGS. 1a-5c may be implemented in one embodiment with a mux arrangement such as that of mux 600 in which two adjacent configuration bits controlling part of a routing input mux's second stage are programmed to select between either an $A_n$ or a $B_n$ input coupled to vertical routing wires associated with the redundancy scheme. In other examples, within the context of second stage redundancy protection as just described, inputs occupying similar positions to that of inputs X0, Y0, X1, and Y1 in a mux similar to mux 600 could also be used to receive signals from vertical lines associated with the specified same redundancy scheme.

Figures 7A, 7B:
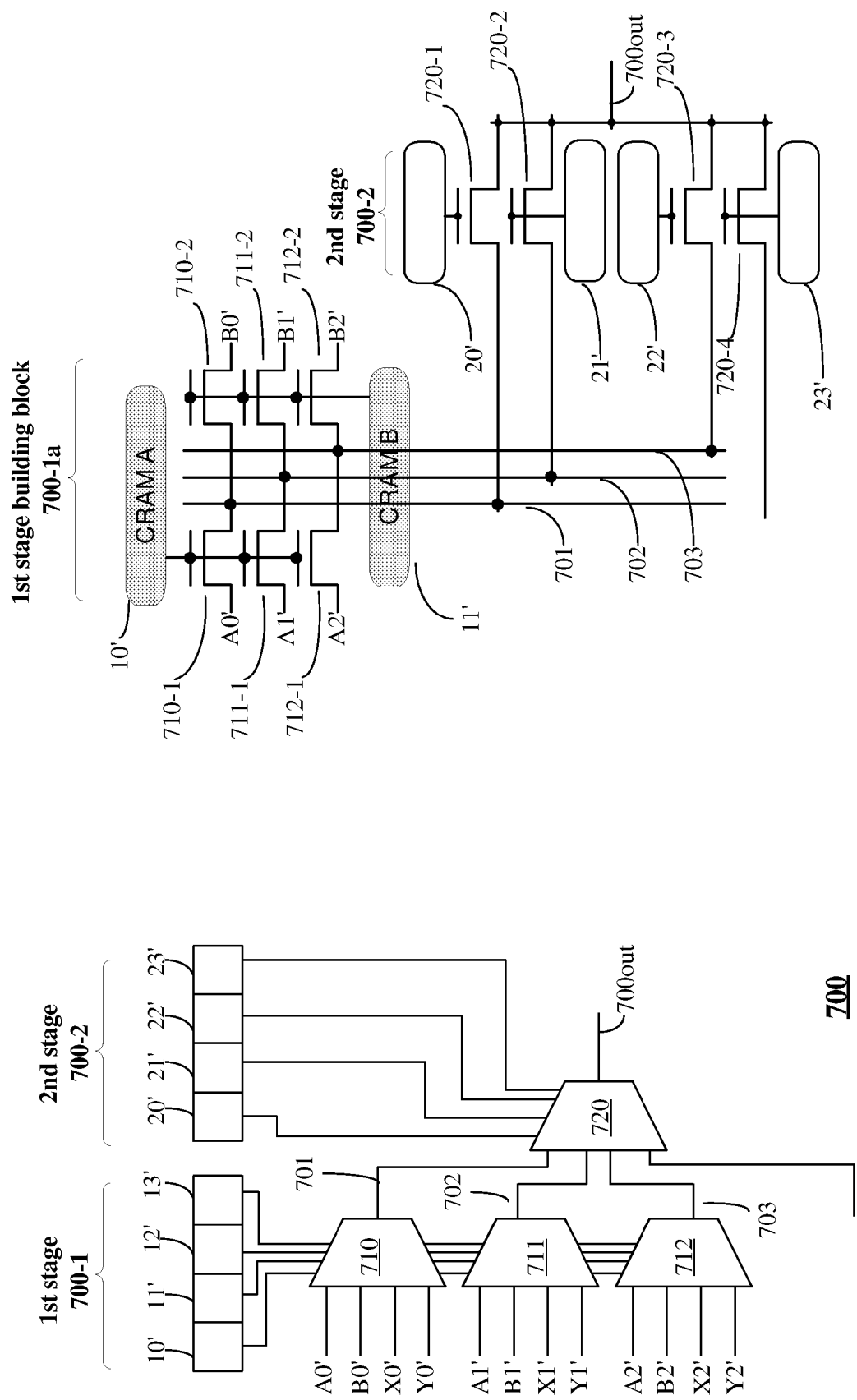
FIGS. 7a-7b illustrate an alternative routing input multiplexer ("mux") 700 with inputs and configuration elements arranged to facilitate implementation of the routing redundancy scheme illustrated in FIGS. 1a-5c.

We now describe "first stage" redundancy protection, one of many possible alternative arrangements, in the context of FIGS. 7a-7b.

FIGS. 7a-7b illustrate an alternative routing input multiplexer ("mux") 700 with inputs and configuration elements arranged to facilitate implementation of the routing redundancy scheme illustrated in FIGS. 1a-5c.

Referring to FIG. 7a, mux 700 includes a first stage 700-1 and a second stage 700-2. First stage 700-1 includes configuration elements 10', 11', 12', and 13' and first stage muxes 710, 711, and 712. Configuration elements 10', 11', 12', and 13' are coupled to the control inputs of muxes 710, 711, and 712 as shown. First stage muxes 710, 711, and 712 are coupled to receive signals through various inputs. First stage mux 710 is coupled to receive inputs A0', B0', X0', and Y0'; first stage mux 711 is coupled to receive inputs A1', B1', X1', and Y1'; first stage mux 712 is coupled to receive inputs A2', B2', X2', and Y2'. Second stage 700-2 includes configuration elements 20', 21', 22', and 23' and second stage mux 720. Configuration elements 20', 21', 22', and 23' are coupled to control inputs of mux 720 as shown. Second stage mux 720 is coupled as shown to receive input from the outputs of first stage muxes 710, 711, and 712 via respective mux lines 701, 702, and 703. The output of second stage mux 720 provides output for mux 700 at output 700out.

FIG. 7b illustrates a portion of mux 700 of FIG. 7a in further detail. In particular, FIG. 7b illustrates first stage building block 700-1a (one of two first stage building blocks) and further details of second stage 700-2.

First stage building block 700-1a includes transistor pass gates 710-1, 710-2, 711-1, 711-2, 712-1, and 712-2. These transistor pass gates are respectively coupled as shown to inputs A0', B0', A1', B1', A2', and B2'. Pass gates 710-1 and 710-2 are coupled to mux line 701, pass gates 711-1 and 711-2 are coupled to mux line 702, and pass gates 712-1 and 712-2 are coupled to mux line 703. Pass gates 710-1, 711-1, and 712-1 are all coupled to configuration element 10' and pass gates 710-2, 711-2, and 712-2 are all coupled to configuration element 11'. Configuration elements 10' and 11' are respectively labeled "CRAM A" and "CRAM B."

Second stage 700-2 includes transistor pass gates 720-1, 720-2, 720-3, and 720-4 which are coupled to, respectively, configuration elements 20', 21', 22', and 23'. Pass gates 720-1, 720-2, and 720-3 are also respectively coupled to mux lines 701, 702, and 703.

In the present example illustrated in FIGS. 7a-7b, it is understood that inputs A0', B0', A1, B1', A2', and B2' can be coupled to receive signals from vertical routing lines that implement a redundancy scheme consistent with the present invention such as, for example, the vertical lines illustrated in FIGS. 1a-5c. As previously indicated, each routing input mux referenced in FIGS. 1a-5c receives signals from two vertical lines at a pair of inputs $A_n$ and $B_n$. Mux 700 is adapted to receive signals from up to six such vertical lines at three pairs of inputs: (i) A0', B0'; (ii) A1', B1'; and (iii) A2', B2'. It is understood that other inputs to mux 700 (e.g. X0', Y0', X1', Y1', X2', Y2') are used to receive signals from other routing resources (e.g. horizontal lines, LE outputs, etc., or other vertical lines not incorporated into the same redundancy scheme). In other examples, within the context of first stage redundancy protection as described herein, inputs occupying similar positions to that of inputs X0', Y0', X1', Y1', X2', and Y2' in a mux similar to mux 700 could also be used to receive signals from vertical lines associated with the specified same redundancy scheme.

The programming of configuration elements 10 and 11 determines whether respective mux lines 701, 702, 703 receive signals from: (i) respective inputs A0', A1', A2'; (ii) respective inputs B0', B1', B2'; or (iii) neither (i) nor (ii). The programming of configuration elements 20', 21', and 22' determine which mux line (701, 702, 703), if any, is selected to provide signals to output 700out.

Thus, under the arrangement of mux 700 as illustrated in FIG. 7b, whether an A' input or B' input is selected is determined by the programming of configuration elements 10' ("CRAM A") and 11' ("CRAM B"). For example, if configuration element 10' holds a high value and configuration element 11' holds a low value, then signals from inputs A0', A1', and A2' are provided on respective mux lines 701, 702, and 703. Whether A0', A1', and A2' is ultimately provided at 700out depends upon programming of configuration elements in second stage 700-2. However, it is configuration elements 10' and 11', that determine whether "A" inputs or "B" inputs are passed to the second stage. If the bits in elements 10' and 11' are "flipped" such that element 10' holds a low value and element 11' holds a high value, then the B' inputs (i.e. B0', B1', B2') will be passed to the second stage.

Similar to the embodiment of FIGS. 6a-6b, the embodiment of FIGS. 7a-7b illustrates constructing a mux and arranging inputs such that the selection between an $A_n$ input and a $B_n$ input depends upon the programming of two elements in a same vertical span or "frame" of configuration elements. In this FIGS. 7a-7b example, the elements (10' and 11') are associated with the first stage rather than the second stage of the routing input mux.

Those skilled in the art will appreciate that in other contexts a routing input mux might have a fewer or greater number of stages and various alternative arrangements might be utilized to provide selection between A and B inputs based on bit flipping.

Figure 8:
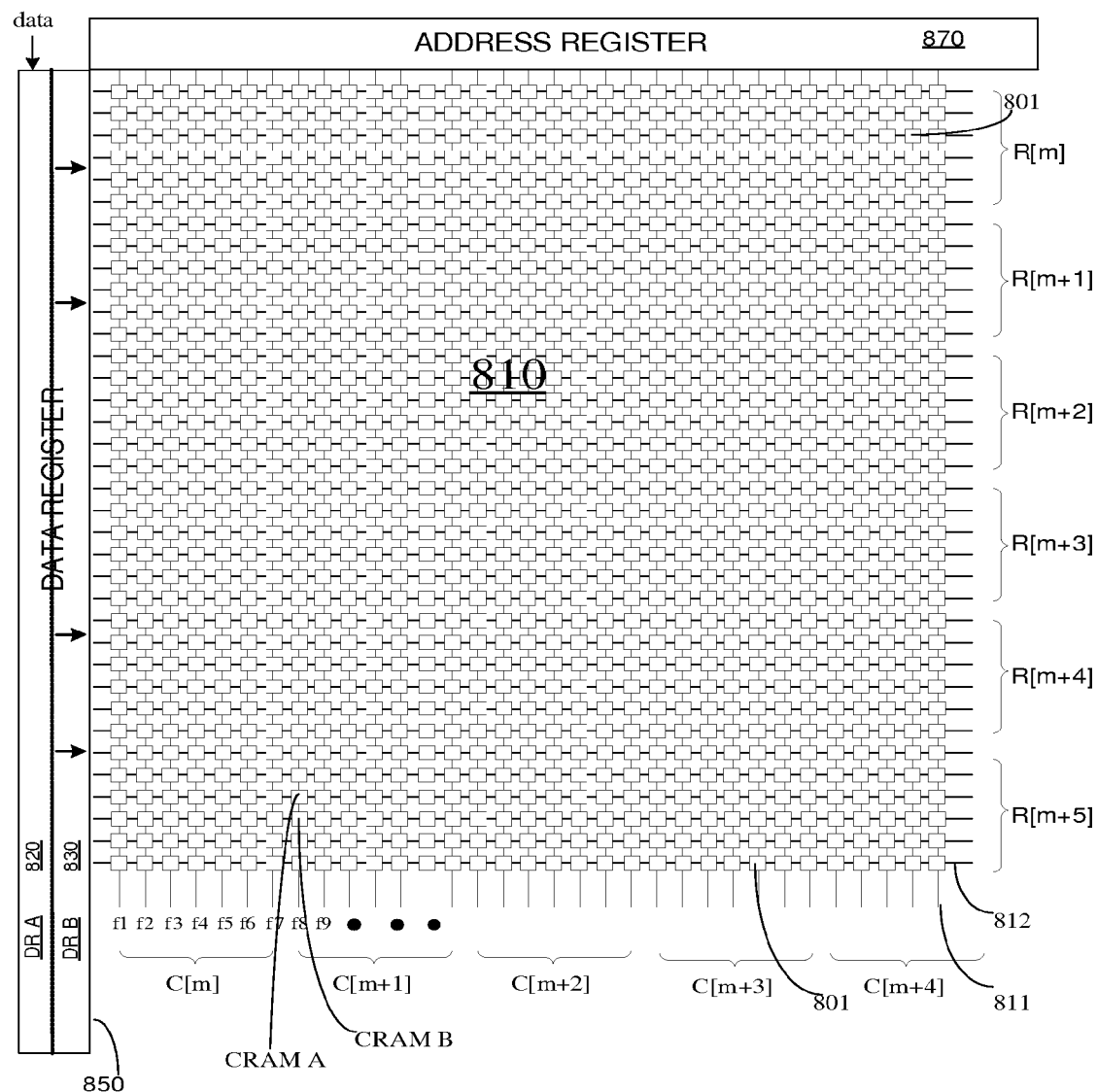
FIG. 8 illustrates a PLD configuration portion 800 illustrative of a configuration portion of a PLD in which an embodiment of the present invention might be implemented.

FIG. 8 illustrates a PLD configuration portion 800 illustrative of a configuration portion of a PLD in which an embodiment of the present invention might be implemented. Portion 800 includes data register 850, address register 870, grid 810 of configuration elements 801, address lines 811 and data lines 812. Data register 850 includes data register A ("DRA") 820 and data register B ("DRB") 830.

The configuration elements 801 are dispersed locally among circuitry of the PLD of which portion 800 is a part. Each configuration element controls circuitry in a LAB row, including, in the FIG. 8 example, LAB rows R[m] to R[m+5]. Several data lines 812 are associated with each LAB row (for example, the FIG. 8 illustration shows six data lines 812 associated with each LAB row R[m] to R[m+5]. Configuration elements of the PLD may also be associated with columns of LABs, including, for example, columns C[m] to C[m+4]. Each LAB column may be programmed by multiple frames in the configuration grid. For example, as illustrated, LAB column C[m] is associated with frames f1, f2, f3, f4, f5, f6, and f7. A "frame" is defined by a single vertical span of configuration elements 801 which are electrically related by an address line 811.

A typical sequence for programming a grid of configuration elements such as grid 810 of elements 801 may be described as follows: Programming data for a single frame is loaded into DRA 820; that data is then loaded into DRB 830; address register 870 "asserts" a frame in the grid 810 of elements 801 by transmitting a high value on a single address line 811 which opens electrical paths over data lines 812 between DRB 830 and a particular frame (e.g. frame f1) of configuration elements. This sequence is repeated on a frame by frame basis until data for all frames in the grid 810 has been loaded.

The term "frame" as used herein may refer either to an electrically related vertical span of configuration elements or to the configuration data to be loaded into those elements. Referring to FIG. 8, two exemplary configuration elements 801 in frame f8 have been labeled "CRAM A" and "CRAM B" to illustrate two consecutive elements in a same frame of configuration elements consistent with the example of either FIGS. 6a-6b or 7a-7b.

Figure 9:
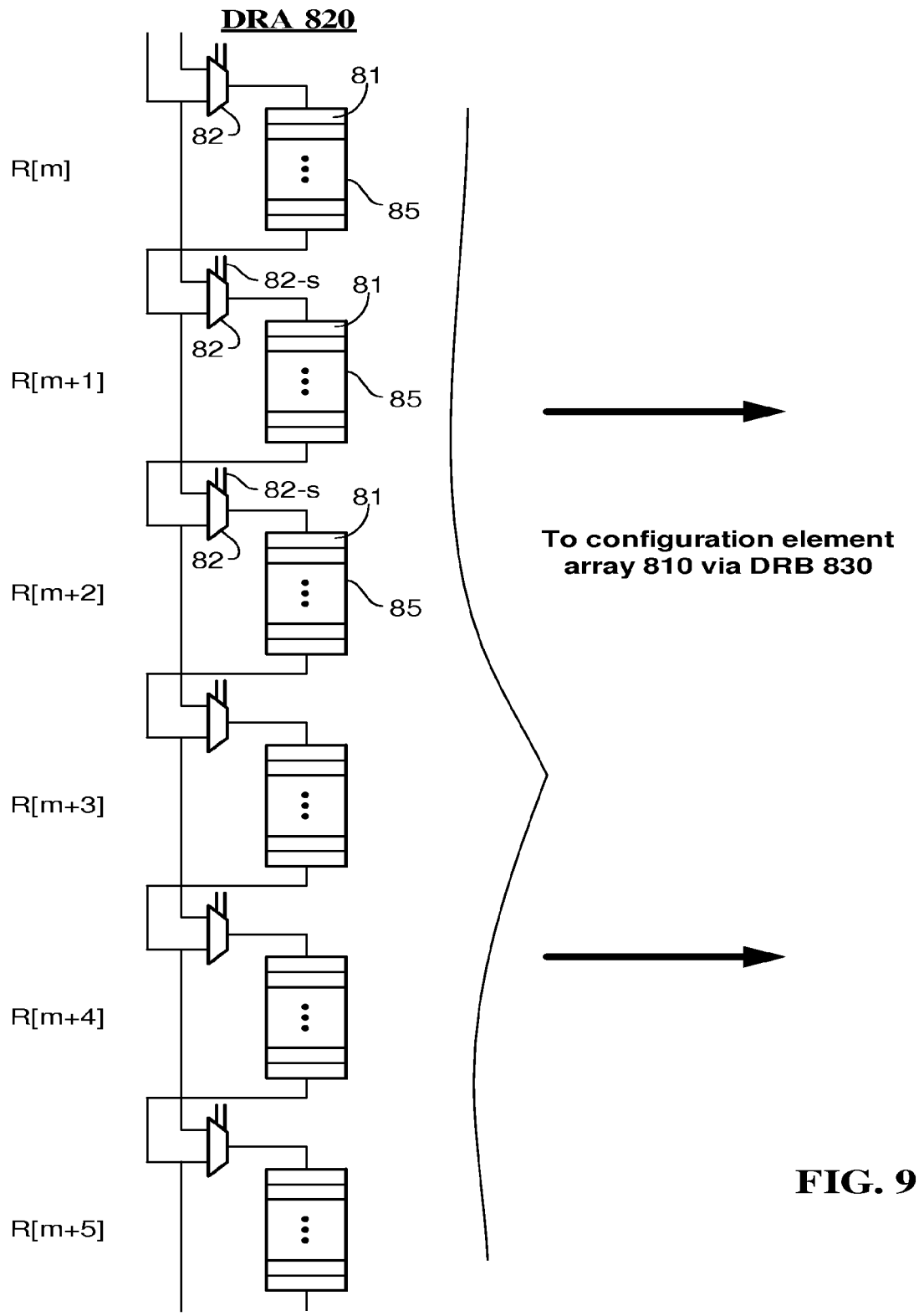
FIG. 9 illustrates further details of DRA 820 of FIG. 8.

FIG. 9 illustrates further details of DRA 820 of FIG. 8. DRA 820 includes shift segments 85 and muxes 82, coupled together as shown. Shift segments 85 include shift elements 81. Data is loaded into DRA 820 from the top and shifted into the various shift elements 81 of shift segments 85. Each shift element 81 holds a single bit corresponding to a bit to be loaded into a configuration element 801 of FIG. 8. Each shift segment 85 can hold data for configuration elements associated with a particular LAB row (e.g. R[m], R[m+1], R[m+2], etc.). Based on redundancy modes, muxes 82 are controlled at control inputs 82-s to select input data from either the shift segment 85 of the previous row, the row before the previous row, or neither. Those skilled in the art will understand that the arrangement of FIG. 9 allows rows to be either selectively bypassed or shifted to the next row below in order to accomplish row shifting for various normal and redundant modes such as, for example, those illustrated in FIGS. 1a-5c. Those skilled in the art will appreciate that there are many alternative examples for effective row shifting structures and methods. To cite but one alternative example, muxes such as mux 82 might be relied on for row shifting without being relied on for implementing row bypass. In such an alternative, row bypass might instead be accomplished by clearing values loaded into the relevant shift segment corresponding to a bypassed row. The example of FIG. 9 provides one exemplary aspect of the context in which the present invention may be implemented.

Figure 10:
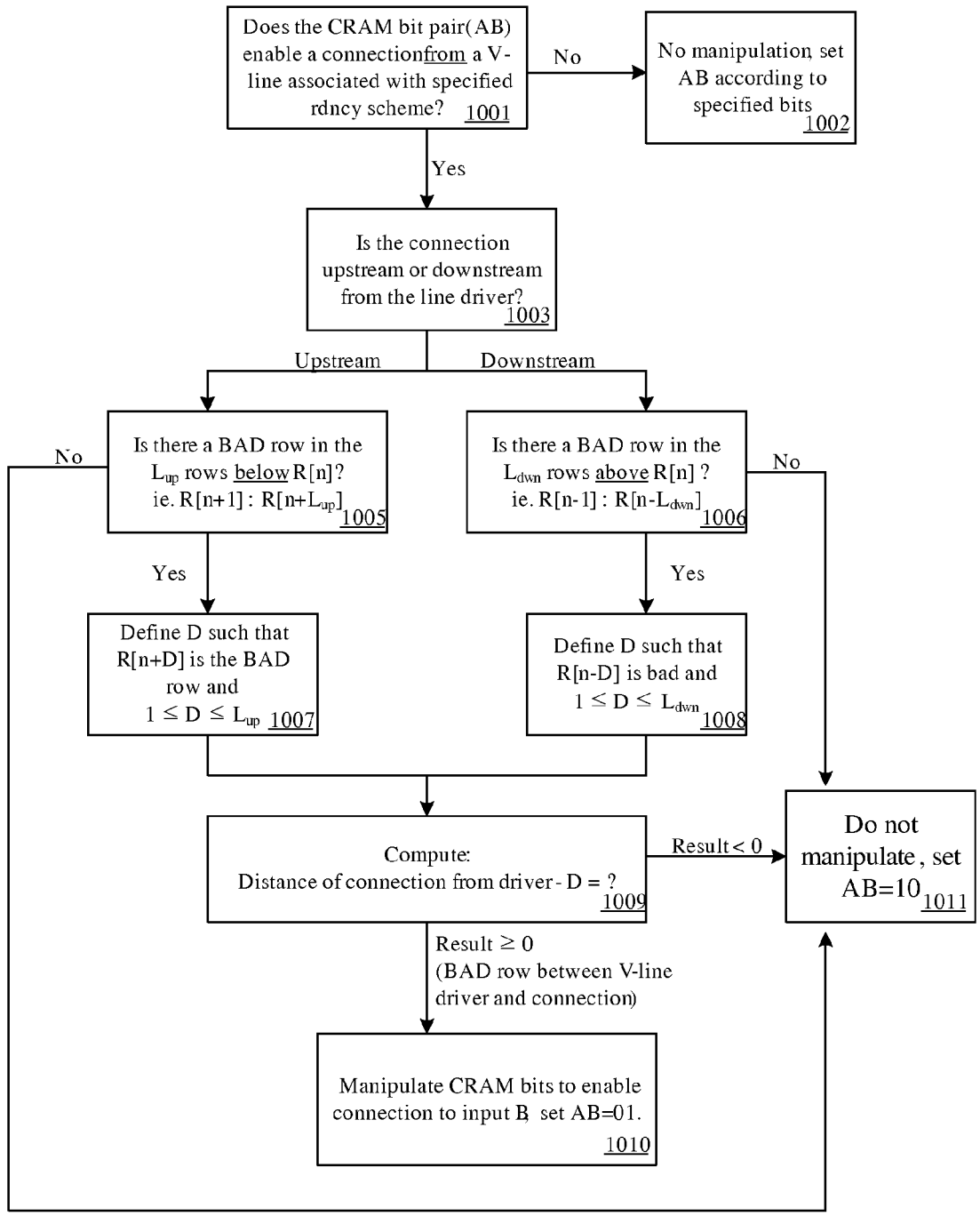
FIG. 10 is a flow diagram illustrating a process 1000 for implementing a bit flip decision with respect to two configuration bits A and B such as the configuration bits labeled "CRAM A" and "CRAM B" in FIGS. 6b and 7b.

FIG. 10 is a flow diagram illustrating a process 1000 for implementing a bit flip decision with respect to two configuration bits A and B such as the configuration bits labeled "CRAM A" and "CRAM B" in FIGS. 6b and 7b. This bit flip decision can determine the selection between an "$A_n$" mux input and a "$B_n$" mux input such as the mux inputs referenced in the context of FIGS. 1a-5c.

From the perspective of a particular routing element, the selection of A or B mux inputs results in selection of a first or second vertical line from which to receive signals. For example, referring to FIG. 1b, mux 124 may select between line 111b and 112b for routing signals to driver 134. As will be described further below, this selection may be based on a condition related to redundancy, such as, for example, whether or not a designated bad row (e.g. a defective redundant mode row, or a unused spare row in normal mode) is between a driver row and connection row. In other examples, other conditions related to redundancy (including conditions that may exist in a normal mode or a redundant mode and are related to one or more redundancy schemes for which the device has been designed) may also trigger such a selection.

In one aspect, such redundancy-related selections may result in the locating of a particular logical line on a particular physical line. Such a logical line may then become one of many logical lines which may be chosen for routing particular signals in the context of designs ultimately implemented by a user. However, the illustrated exemplary processes below, including those of FIG. 10 and FIG. 12, do not necessarily need to take into account the location of a particular logical line. These processes just rely on the information relating to the relationship between designated bad rows, routing element rows, V-line driver rows, and whether a connection is upstream or downstream. Alternative processes might rely on a different perspective. An alternative process might, for example, take into account whether a particular logical line (that ultimately will be made available to a user) is implemented on a first vertical line or a second vertical line. From this perspective, the decision to locate a given logical line on a first or second vertical line might, for example, depend on whether the first vertical line's driver is in a shifted row.

Returning to the exemplary embodiment of FIG. 10, process 1000 assumes that, as a default, a pair of bits "AB" for mux inputs coupled to V-lines associated with the redundancy scheme illustrated in FIGS. 1a-5c is set to "10." Such a setting effects selection of the $A_n$ mux input (in the illustrated examples of FIGS. 1a-5c, the $A_n$ input is coupled to one V4 line and the $B_n$ mux input is coupled to another V4 line). Process 1000 further assumes that some configuration bit pairs will not relate to selection of inputs coupled to V-lines associated with the redundancy scheme illustrated in FIGS. 1a-5c. Given these assumptions, process 1000 determines whether a particular bit pair is associated with mux inputs coupled to vertical lines associated with the specified redundancy scheme (e.g. the V4 lines in FIGS. 1a-5c) and, if so, whether those bits should be set at "10" to select the $A_n$ input or should be "flipped" and set at "01" to select the $B_n$ input.

At block 1001, process 1000 determines whether the particular bit pair AB enables a connection from V-lines associated with the specified scheme. If this determination is "No," then, as indicated by block 1002, process 1000 does not manipulate the bit pair and the bit pair retains whatever values have already been specified. If this determination is "Yes," block 1003 determines whether the connections from the V-lines being configured are upstream or downstream from the line driver (i.e. upstream or downstream relative to redundancy row shifting direction).

If the relevant V-line connections are upstream from the line drivers, block 1005 determines whether there is a BAD row in the $L_{up}$ rows below row R[n]. "$L_{up}$" is the upstream logical length of the V-line. In this case, that length is four. Row R[n] refers to the row (after row shifting, if any, has taken place) associated with the routing input mux being programmed by the bit pair AB. A "BAD" row simply means that in the given mode (normal or redundant) the row is not being used. In a normal mode of the PLD, a row that has been designated to be a spare row would not be used. Thus, from the perspective of process 1000, a spare row is a "bad" row if the PLD portion including that row or row portion is operating in normal mode, even though such a row may not be defective. Thus "bad" in this context is just a designation for identifying a row or row portion that is not used in a particular mode, normal or redundant. If the result of block 1005 is "No" then, as indicated by block 1011, the bits are set at AB=10 to select the $A_n$ input. Note, it is assumed that this is the default bit setting absent application of process 1000. If the result of block 1005 is "Yes" then block 1007 defines "D" such that row R[n+D] is the bad row and $1 \leq D \leq L_{up}$. Block 1009 determines (or identifies) the logical distance between the connection and the driver of the V-line coupled to the $A_n$ input of the relevant routing input mux and subtracts "D" from the value of that distance. If the result of block 1009 is $\geq 0$, i.e. if there is a BAD row between the relevant V-line driver and the connection, then, as indicated by block 1010, the bit pair is manipulated to set AB=01, which selects the $B_n$ input of the routing input mux. If the result of block 1009 is <0, i.e. if there is not a BAD row between the row R[n] connection and the V-line coupled to the $A_n$ input of the relevant routing input mux, then, as indicated by block 1011, the bit pair is set to AB=10 to select the $A_n$ input.

If the relevant V-line connections are downstream from the line drivers, block 1006 determines whether there is a BAD row in the $L_{dwn}$ rows above row R[n]. "$L_{dwn}$" is the downstream logical length of the V-line. If the result of block 1006 is "No" then, as indicated by block 1011, the bits are set at AB=10 to select the $A_n$ input. If the result of block 1006 is "Yes," then block 1008 defines "D" such that row R[n–D] is the bad row and $1 \leq D \leq L_{dwn}$. Using the "D" defined in block 1008, process 1000 proceeds from block 1009 as previously described.

One skilled in the art will appreciate that process 1000 of FIG. 10, can be carried out assuming that redundancy row shifting, if any, has or will occur. In one aspect of this embodiment, such transparency allows other redundancy schemes to be implemented on the same PLD for connections associated with other V-lines not utilizing the specified scheme illustrated in FIGS. 1a-5c. For example, with respect to connections from longer V-lines, such as V16 lines (i.e. logical length of sixteen), a different scheme that involves providing multiple drive points in different rows to effect row shifting without shifting logical lines to different physical wires may be implemented on the same PLD in which the specified scheme illustrated in FIGS. 1a-5c is applied to V4 line connections. For an example of such a scheme that includes multiple drive points on a single line, see certain aspects of the disclosure in U.S. application Ser. No. 10/159,581 (entitled "Programmable Logic Device with Redundant Circuitry"). (Note that U.S. application Ser. No. 10/159,581 discloses many aspects and nothing stated here or in that patent should be interpreted as limiting the scope of the other.)

One skilled in the art will further appreciate that process 1000 represents logic that can readily be implemented in software, hardware, or a combination of hardware and software.

Figure 11:
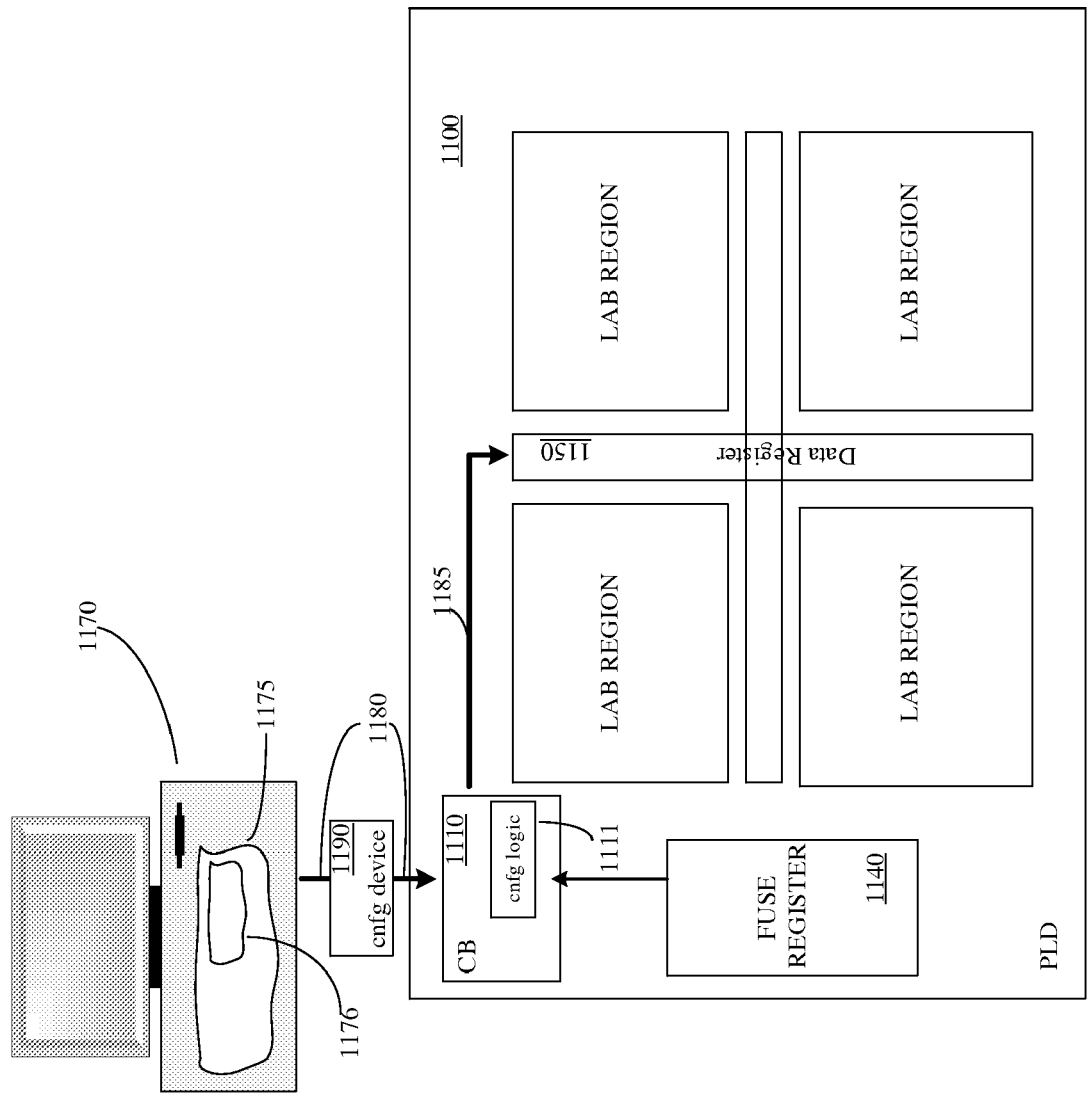
FIG. 11 illustrates programming of a PLD 1100 by a user computer 1170 consistent with an aspect of an embodiment of the present invention.

FIG. 11 illustrates programming of a PLD 1100 by a user computer 1170 consistent with an aspect of an embodiment of the present invention. User computer 1170 includes a configuration program 1175 for generating programming data 1180 that is transmitted to configuration memory device 1190 and then to PLD 1100. Memory device 1190 holds programming data 1180 and, during a designated mode, transmits the data 1180 to PLD 1100. (In alternative examples, data may be transmitted directly from a user computer to a PLD without first being held by a separate device; also, in particular alternative examples, a configuration memory device may be part of the PLD itself). PLD 1100 includes control block ("CB") 1110, data register 1150, and fuse register 1140. Fuse register 1140 holds information indicating whether particular rows are designated "bad" (which, as already explained, may include non-defective spare rows in normal mode or defective other rows in redundant mode). The term "fuse register" herein is simply a label to refer to such a register; in particular examples, such registers may or may not be fuse programmed registers. CB 1110 receives programming data 1180 and uses that data to generate configuration bit stream 1185 which is provided by the control block 1110 to data register 1150 to configure regions of PLD 1100. Configuration program 1175 includes a portion 1176. Control block 1110 includes configuration logic 1111.

Together, software portion 1176 on user computer 1170 and configuration logic portion 1111 in PLD 1100 implement process 1000 of FIG. 10 (and logic portion 1111 also utilizes data from fuse register 1140 as part of implementing process 1000). In particular, software portion 1176 encodes AB bit pairs with information indicating whether the bit pairs are for programming connections from V-lines associated with the specified redundancy scheme (e.g. the V4 lines illustrated in FIGS. 1a-5c) and, if so, whether those connections are upstream or downstream from the relevant line drivers. Furthermore, software portion 1176 also encodes AB bit pairs with information indicating the distance between a relevant V-line driver and a row of the V-line connection configured by the AB bit pair. Thus, software portion 1176 of FIG. 11 adds information to programming data 1180 sufficient for performing the process 1000 steps illustrated by blocks 1001 and 1003 of FIG. 10 and also adds information used in performing the step illustrated in block 1009. In the context of V4 lines, if a uniform 4-bit encoding scheme is employed, a four bit stream within programming data 1180 used to convey this information about a bit pair is summarized in the following Table I:

TABLE I

| Bit3 (indicates whether redundancy protected) | Bit2 | Bit1 | Bit0 |
|---|---|---|---|
| 0 | 0 (padding) | Data 1 | Data 0 |
| 1 | Up/Down | Distance 1 | Distance 0 |

Referring to the second row of the above Table I, if Bit3 is "0", then the redundancy protection provided by the present scheme is not utilized (e.g. the relevant connections are not from a V4 line associated with the present redundancy scheme). This result implicates block 1002 of process 1000, thus the programming bits will be set as determined by program 1175. Therefore, the values for the A and B configuration bits themselves are included as "Data1" and "Data 0" in the programming data 1180 in a particular four-bit stream as Bit1 and Bit0. In this case, Bit2 is a simply a padding bit for consistency and is set to 0. When CB 1110 and logic 1111 receive this bit sequence, it recognizes that, because Bit3 is "0", Data 1 and Data 0 provide the configuration values to be included in configuration bit stream 1185 loaded into data register 1150.

Referring to the third row of Table I, if Bit3 is "1," then the redundancy protection of the present scheme is invoked. In this case, more information is needed before the correct values of the "AB" pair can be determined. Thus, in this case, program portion 1176 encodes information to be used by logic 1111 in determining the values for the AB pair. In particular, Bit2 is used to indicate whether the V4 line connection is upstream or downstream.

Bit1 and Bit0 are used to indicate the distance between the connection and the relevant V-line driver. Note that in the case of a V4 line, the maximum value for this distance is "four," thus, in the illustrated example, two bits are necessary and sufficient to represent this information. Those skilled in the art will understand that the presently illustrated embodiment may be modified to include more bits if the redundancy scheme is applied to connections from longer V-lines. Also, the number of bits required to convey information for a given length line, or other information, may vary if different and/or non-standard types of binary encoding are used.

Returning to the illustrated example, in the case that Bit3 is "1", logic 1111 of CB 1110 uses the information provided with Bit2 (indicating whether lines are upstream or downstream) and Bit1 and Bit0 (indicating distance between connection and relevant driver), as well as information provided from Fuse Register 1140 regarding which rows are designated "BAD" to carry out process 1000 to determine what values to set for the AB bit pair; and then CB 1110 provides those values in configuration bit stream 1185 for loading into data register 1150.

Those skilled in the art will appreciated that many alternatives to the software/hardware division illustrated in FIG. 11 for implementing a process such as process 1000 of FIG. 10 (or another process within the scope of the present invention) may be utilized without necessarily departing from the present invention's spirit and scope. To cite but one example, a configuration program on a user computer might, in an alternative, receive "bad" row data from a PLD fuse register, carry out the entire process 1000 in software, and then transmit programming data to a PLD that already includes explicit bit determinations for all AB pairs. To cite but one other example, all of the logic for process 1000 might be implemented in a control block of a PLD based on fuse information and information generated on-chip regarding whether bits configure connections to upstream or downstream lines associated with particular redundancy schemes and the distance between those connections and relevant V-line drivers. To cite but one other example, the hardware for implementing a bit "flip" or bit "selection" might include hardware outside of a PLD's control block, such as, for example, hardware distributed in the data register or distributed locally to relevant configuration elements. Examples of such alternative hardware distributions might include multiplexers between elements such as elements 81 of DRA 820 of FIG. 9 to effect bit flipping within the data register, or, alternatively, additional 2:1 muxes might be provided local to configuration elements such as those labeled "CRAM A" and "CRAM B" in either FIG. 6b or 7b, such 2:1 muxes effecting local bit routing between a "CRAM A" and a "CRAM B." Those skilled in the art will recognize that these and other alternatives to the illustrated embodiments are possible without necessarily departing from the spirit and scope of the present invention.

In the primary illustrated embodiment, on-chip logic such as configuration logic 1111 is implemented by dedicated circuitry. However, in alternatives, such on-chip logic may be implemented by a general purpose processor embedded on the chip that runs software for implementing a process or process portion in accordance with the present invention. In one example, such software may be downloaded from a user computer such as user computer 1170 as part of the execution of a configuration program such as program 1175.

Figure 12:
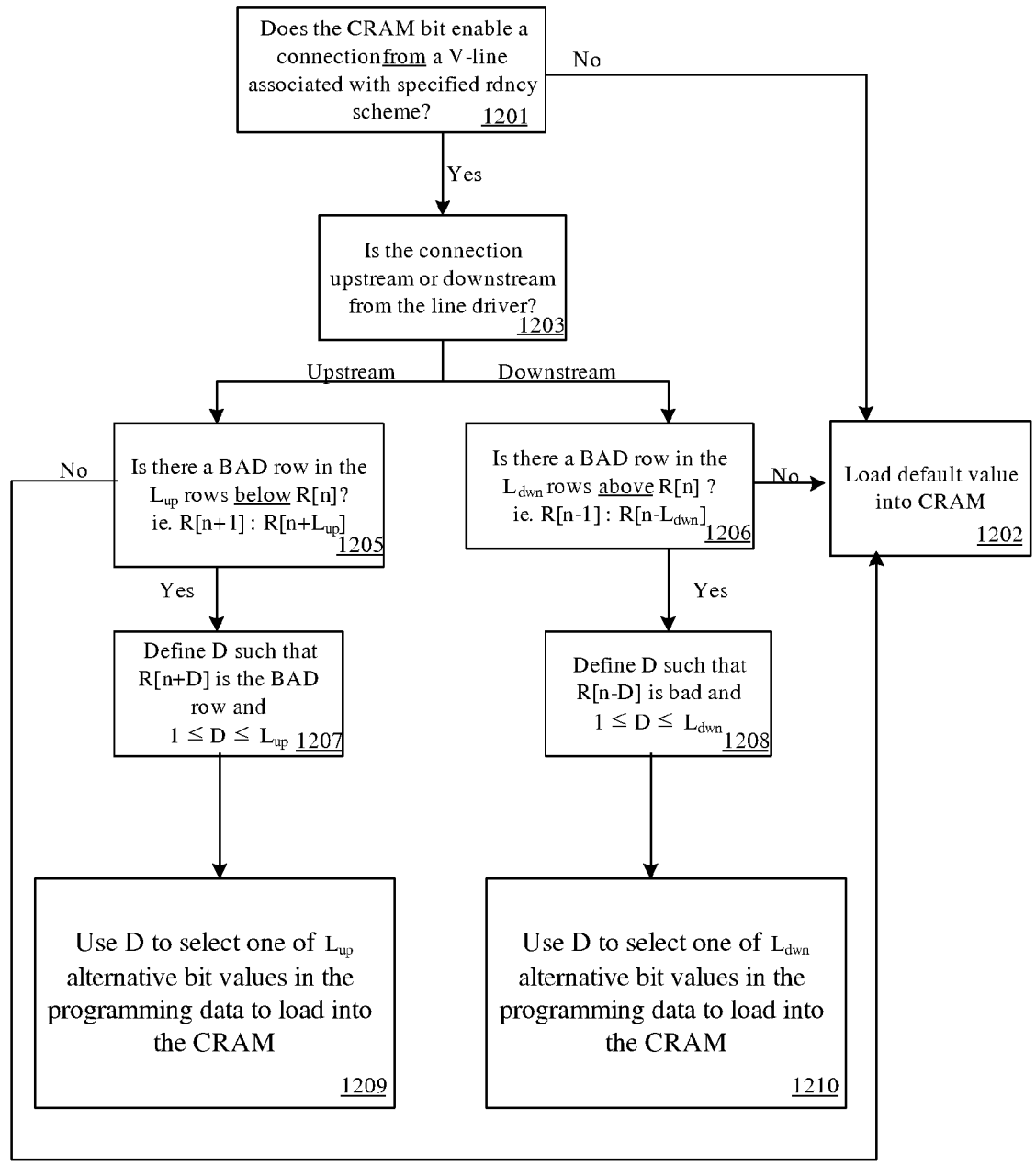
FIG. 12 is a flow diagram illustrating a process 1200 for implementing a bit setting decision with respect to a configuration bit for a routing connection. Process 1200 of FIG. 12 may be implemented as an alternative to process 1000 of FIG. 10.

FIG. 12 is a flow diagram illustrating a process 1200 for implementing a bit setting decision with respect to a configuration bit for a routing connection. The result of such a bit setting decision can control a mux input such as, for example, either an "$A_n$" or a "$B_n$" mux input referenced in the context of FIGS. 1a-5c. Process 1200 of FIG. 12 illustrates one of many possible alternatives to process 1000 of FIG. 10 consistent with the scope of the present invention. Process 1200 treats bits individually rather than as pairs. Process 1200 may be applied whether or not the bits being set relate to consecutive configuration elements in a same frame of such elements.

Process 1200 assumes that the programming data for setting the bit specifies a default value, and then determines whether that default value should be modified.

At block 1201, process 1200 determines whether the particular bit to be set is for enabling a connection from a V-line associated with the specified scheme (e.g. the V4 lines illustrated in FIGS. 1a-5c in the context of applying this example to the scheme illustrated in those figures). If this block 1201 determination is "No," then, as indicated by block 1202, process 1200 sets the configuration bit (the bit to be loaded into the relevant CRAM) at the default value. If this block 1201 determination is "Yes," then block 1203 determines whether the connection being configured is upstream or downstream from the line driver (i.e. upstream or downstream relative to redundancy row shifting direction).

If the relevant V-line connection is upstream from the line driver, block 1205 determines whether there is a BAD row in the $L_{up}$ rows below row R[n], where $L_{up}$ is the upstream logical length of the V-line. Row R[n] refers to the row (after row shifting, if any, has taken place) associated with the routing input mux being programmed by the bit. If the result of block 1205 is "No" then, as indicated by block 1202, the bit is set to the default value. If the result of block 1205 is "Yes" then block 1207 defines "D" such that row R[n+D] is the bad row and $1 \leq D \leq L_{up}$. Block 1209 uses D to select from alternative bit values encoded in the programming data to set the bit. The encoding and selection of alternative bit values is further described below in the context of Table II.

If the relevant V-line connection is downstream from the line driver, block 1206 determines whether there is a BAD row in the $L_{dwn}$ rows above row R[n], where $L_{dwn}$ is the downstream logical length of the V-line. If the result of block 1206 is "No" then, as indicated by block 1202, the bit is set according to the default value specified in the programming data. If the result of block 1206 is "Yes," then block 1208 defines "D" such that row R[n−D] is the bad row and $1 \leq D \leq L_{dwn}$. Using the "D" defined in block 1208, process 1200 proceeds in block 1210 to select from alternative bit values encoded in the programming data to set the bit.

Process 1200 may be implemented using a combination of a user configuration program such as a modified version configuration program 1175 in FIG. 11 and on-chip logic such as a modified version of configuration logic 1111 of FIG. 11. Such a configuration program would provide programming data for loading into the PLD. In the context of programming data provided by the configuration program for configuring a bit to program a connection from a V4 line (such as, for example, a bit to program an "$A_n$" or a "$B_n$" mux input of the muxes in FIGS. 1a-5c), the seven bits of programming data used in this example for encoding a single bit value to be loaded into a CRAM may be explained with reference to the following Table II:

TABLE II

| Bit6' (redundancy protected?) | Bit5' | Bit4' | Bit3' | Bit2' | Bit1' | Bit0' |
|---|---|---|---|---|---|---|
| 0 | 0 (padding) | Default value | 0 (padding) | 0 (padding) | 0 (padding) | 0 (padding) |
| 1 | Up/Down | Default value | Value if D = 1 | Value if D = 2 | Value if D = 3 | Value if D = 4 |

Table II represents data provided by a configuration program running on a user computer that the PLD can use to set a particular configuration bit for programming a particular CRAM consistent with process 1200 of FIG. 12. Referring to Table II, Bit6' indicates whether or not the connection being programmed is a connection from a V-line associated with the specified redundancy scheme. Determining the value of this bit relates to block 1201 of process 1200 and may be performed by the configuration program. Referring to the second row of Table II, if the connection does not relate to a V4 line connection associated with the specified redundancy scheme, then Bit6'=0. As indicated by block 1202, when the connection does not relate to a relevant redundancy connection, the default value is selected for setting the relevant CRAM bit. Setting the relevant CRAM bit to the default value may be performed on-chip by configuration logic based upon Bit6', which indicates that the default value is to be set, and Bit4', which indicates what that default value is. In this case, the remaining bits of Table II, including Bit5', Bit3', Bit2', Bit1', and Bit0', are all included as padding for consistency (i.e. so that the programming data for each bit to be set has a consistent length of 7 bits) and they are set to "0."

Referring to the third row of Table II, if Bit6' indicates that the connection relates to a V4 line connection associated with the specified redundancy scheme, i.e., in this example, Bit6'=1, then, as indicated by block 1203, process 1200 determines whether the connection is upstream or downstream from the line. Block 1203 of process 1200 may be performed by the configuration program and the result of block 1203 is represented by Bit5', which indicates whether the connection is upstream or downstream. In this case, Bit4' again indicates a default value. Determining the default value may be performed by the configuration program. Bit3', Bit2', Bit1', and Bit0', each indicate values which the CRAM bit should be set if a particular row, relative to the connection row, is bad. In this example, determining whether a particular row is bad is performed on-chip by configuration logic based on input from a fuse register. Such configuration logic uses bad row data to perform either steps 1205 and 1207 (if an upstream connection) or steps 1206 and 1208 (if a downstream connection), and then uses the results of those steps, i.e. D where D is the distance of the bad row from the connection row, to select the value of the CRAM bit from one of Bit3', Bit2', Bit1' or Bit0'. In this example, the value of these bits are determined by the configuration program and included with the programming data, while the selection of one of the values to set the CRAM bit, is done by the on-chip configuration logic.

One skilled in the art will appreciate that process 1200 of FIG. 12, like process 1000 of FIG. 10, allows other redundancy schemes to be implemented on the same PLD for connections associated with other V-lines not utilizing the specified scheme illustrated in FIGS. 1a-5c. One skilled in the art will further appreciate that process 1200 represents logic that can readily be implemented in software, hardware, or a combination of hardware and software. The above just describes one exemplary example of a software/hardware division within the scope of the present invention.

Figure 13A:
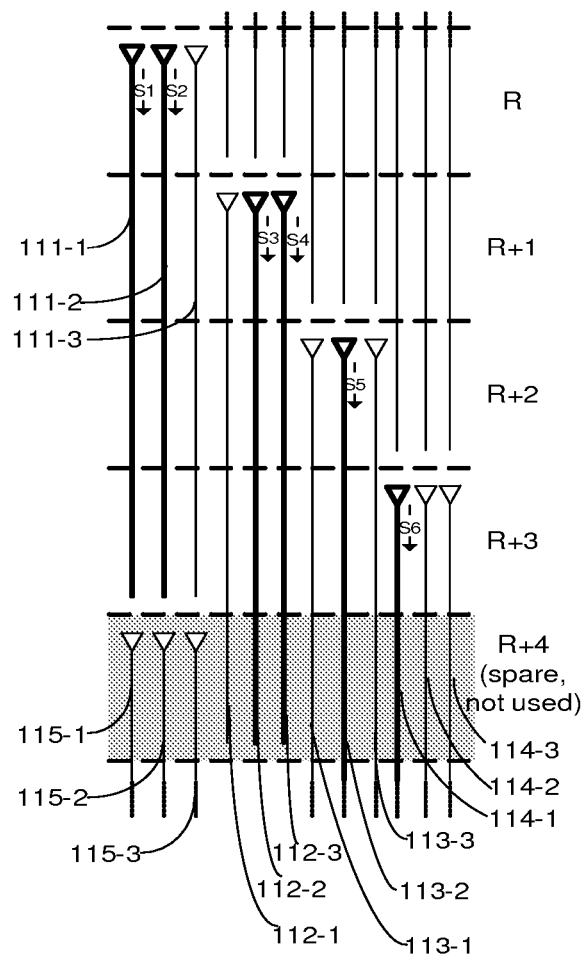
FIGS. 13a and 13b illustrate a physical arrangement of track groups for vertical routing lines in a PLD portion 1300 operating in a normal (FIG. 13a) and a redundant (FIG. 13b) mode.
Figure 13B:
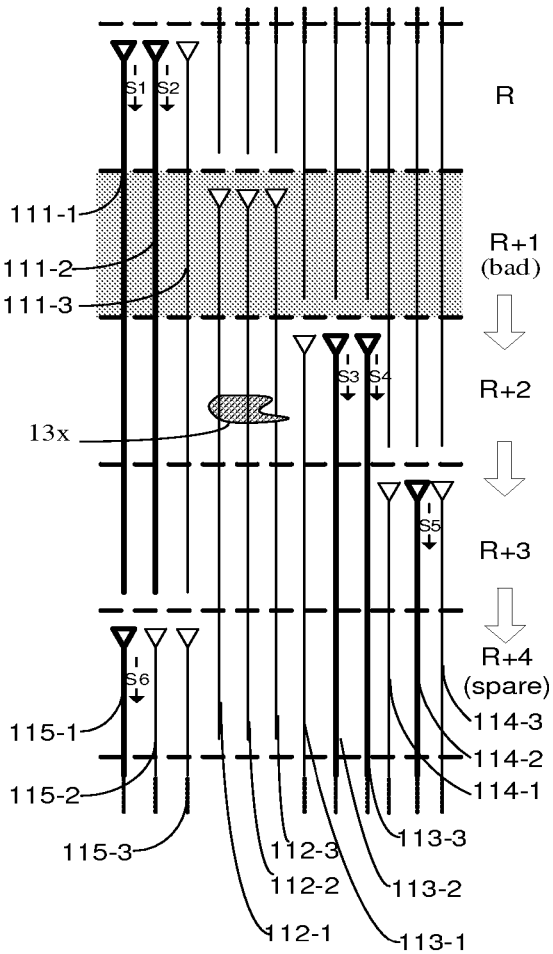

FIGS. 13a and 13b illustrate a physical arrangement of track groups for vertical routing lines in a PLD portion 1300 operating in a normal (FIG. 13a) and a redundant (FIG. 13b) mode. The arrangement shown, in the context of a staggered segmented routing architecture for vertical lines that has redundancy capability, is useful for enhancing reparability consistent with an aspect of an embodiment of the present invention.

Referring to FIG. 13a, portion 1300 includes vertical lines and portions of vertical lines that together span five rows (R, R+1, R+2, R+3, and R+4) of the PLD of which portion 1300 is a part. The lines illustrated may be described as being arranged in track groups, each group including vertical lines driven from a particular row. A first group includes lines 111-1, 111-2, and 111-3 driven from row R. A second group includes lines 112-1, 112-2, and 112-3 driven from row R+1. A third group includes lines 113-1, 113-2, and 113-3 driven from row R+2. A fourth group includes lines 114-1, 114-2, and 114-3 driven from row R+3. And a fifth group includes lines 115-1, 115-2, and 115-3 driven from row R+4. Representative signals S1, S2, S3, S4, S5, and S6, are shown on, respectively, lines 111-1, 111-2, 112-2, 112-3, 113-2, and 114-1 to illustrate just some of the possible signal paths provided in the normal mode illustrated in FIG. 13a. Row R+4 is a spare row, and thus not used in the illustrated normal mode. Thus, as illustrated in FIG. 13a, none of the lines driven from row R+4 are used to provide signal paths.

Referring to FIG. 13b, the same portion 1300 is illustrated, except that in the FIG. 13b example, defect 13× has rendered lines 112-1, 112-2, and 112-3 defective. Although the defect is shown to be on the portion of those lines in row R+2, row R+1 is the resulting defective row because the defective lines are driven from row R+1. A repairable region is defined above spare row R+4. A redundancy scheme is invoked to shift rows R+1, R+2, and R+3 to repair the PLD in light of the defect to row R+1. The indicated row shifting allows redundant mode paths for signals S1, S2, S3, S4, S5, and S6. As illustrated, signals S1 and S2 remain on respective lines 111-1 and 111-2 (driven from row R, which does not shift in the illustrated mode). However, the other signals, S3, S4, S5, and S6 are shifted to respective lines 113-2, 113-3 (driven from row R+2), 114-2 (driven from row R+3), and 115-1 (driven from row R+4).

Some defects span multiple lines. However, if those multiple lines are driven from the same row, such defects potentially can be repaired through row shifting and use of a single spare row in a particular repairable region. Thus, by placing at least some wires driven from the same row close together, the probability that a single defect spanning multiple lines can be repaired is enhanced.

Figures 14A, 14B:
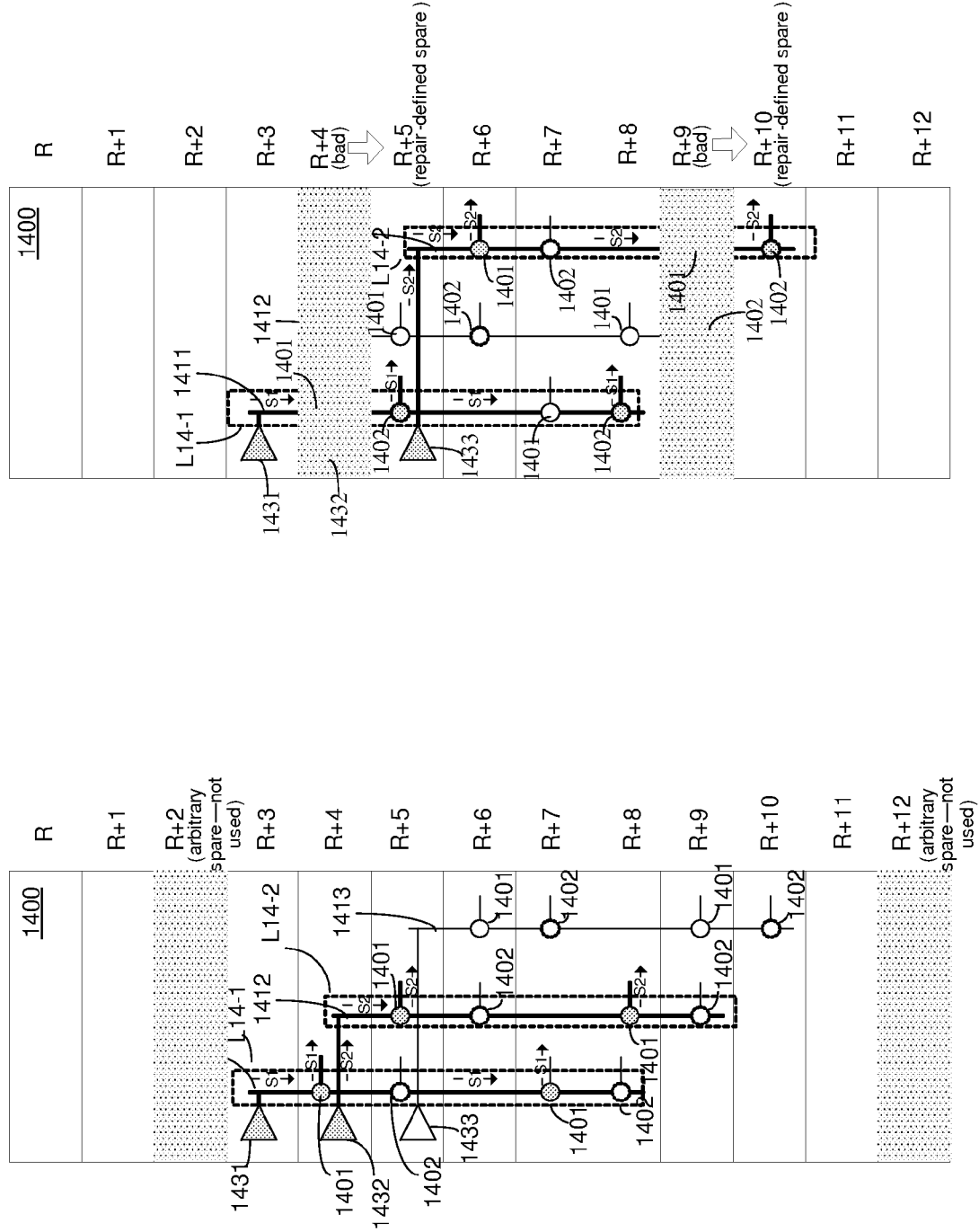
FIGS. 14a and 14b illustrate routing from vertical lines for selected rows in a portion 1400 of a PLD operating in normal (FIG. 14a) and redundant (FIG. 14b) modes in accordance with an embodiment of the present invention in which spare rows are repair-definable to maximize repair.

FIGS. 14a and 14b illustrate routing from vertical lines for selected rows in a portion 1400 of a PLD operating in normal (FIG. 14a) and redundant (FIG. 14b) modes in accordance with an embodiment of the present invention. In the PLD portion illustrated, spare rows are repair-definable to maximize repair.

Referring to FIG. 14a, PLD portion 1400 includes vertical lines 1411, 1412, and 1413; drivers 1431, 1432, and 1433; connections 1401; and connections 1402. In order to avoid over complicating the drawings, routing input muxes are not separately shown. However, it is understood that a connection 1401 is a connection to the $A_n$ input of a routing input mux associated with the row corresponding to the particular 1401 connection and a connection 1402 is a connection to the $B_n$ input of a routing input mux associated with the row corresponding to the particular 1402 connection. The PLD portion 1400 illustrated includes thirteen rows (labeled R to R+12) of a logic array of the PLD that includes portion 1400.

As illustrated in FIG. 14a, two logical lines L14-1 and L14-2 are, in a normal mode of PLD portion 1400, implemented on respective first vertical lines 1411 and 1412. Line L14-1, as implemented on line 1411, is driven from row R+3 and, as illustrated, the activated connections to routing input muxes are in row R+4 (via a connection 1401 to the $A_n$ input of a row R+4 routing input mux) and row R+7 (via a connection 1401 to the $A_n$ input of a row R+7 routing input mux). Line L14-2, as implemented on line 1412, is driven from row R+4 and, as illustrated, the activated connections to routing input muxes are in row R+5 (via a connection 1401 to the $A_n$ input of a row R+5 routing input mux) and row R+8 (via a connection 1401 to the $A_n$ input of a row R+8 routing input mux). The logical connectivity lengths provided on both lines L14-1 and L14-2 are one and four.

In the embodiments of FIGS. 14a and 14b, spare rows do not need to be defined until it is known where the defective rows, if any, are. In the FIG. 14a example, there are no defective rows. Thus, spare rows do not need to be used. In a PLD in which the total number of useable rows has been pre-determined for various reasons (e.g. consistency), any additional rows included for redundancy purposes (i.e. spare rows), will not need to be used. In the present embodiment illustrated in FIG. 14a, because spare rows locations do not need to be pre-defined, the spare row locations may be defined arbitrarily. Rows R+2 and R+12 are defined as spare and are not used in the normal mode of FIG. 14a. It will be appreciated, however, that in an alternative to the FIG. 14a example, unused spare rows could also have been designated in rows crossed by the vertical lines. For example, in an alternative, the spare row defined at row R+12 of FIG. 14a, could have been defined in row R+7. In such an alternative, the 1401 connections from, respectively, lines 1411 and 1412 in respective rows R+7 and R+8 could have been moved to the 1402 connections from the same respective lines in respective rows R+8 and R+9, thus maintaining a consistent logical length for lines L14-1 and L14-2 in light of an unused spare row in row R+7.

FIG. 14b illustrates the same PLD portion 1400, except that in the FIG. 14b example, rows R+4 and R+9 are bad. If the spare rows were still fixed at row R+2 and row R+12 as shown in FIG. 14a, defects to rows R+4 and R+9 would imply two bad rows in a single repairable region (defined between spare rows), thus limiting the ability for redundancy row shifting to repair the device. However, in the FIG. 14b example, the location of the two spare rows may be defined to repair both bad rows. As illustrated, spare rows are defined in rows R+5 and R+10. Thus, the redundancy scheme is invoked to shift row R+4 and row R+9 to repair the PLD in light of the defects to those rows. Logical line L14-1 is still implemented on line 1411, however, the connections 1401 in rows R+4 and R+7 shift to respective 1402 connections in rows R+5 and R+8. The logical connectivity lengths provided for logical line L14-1 remain consistent at one and four. Logical line L14-2, however, is shifted to line 1413. On that line, activated connections to routing input muxes are in row R+6 (via a 1401 connection to an $A_n$ input) and in row R+10 (via a 1402 connection to a $B_n$ input). The logical connectivity lengths provided for logical line L14-2 remain consistent at one and four.

In both FIGS. 14a and 14b, signal paths are highlighted to show connectivity provided by L14-1 and L14-2 for exemplary signals S1 and S2.

The physical length of lines 1411, 1412, and 1413 as measured in physical rows is five. The presently illustrated exemplary redundancy scheme allows vertical lines that implement similar connectivity to have consistent physical lengths whether or not those lines cross spare rows. This consistency facilitates flexibility in spare row definition.

It will be appreciated that there are alternatives to the arbitrary definition of spare rows in a perfect device or device portion as illustrated in FIG. 14a. For example, a PLD provider could offer multiple versions of a device. In one such example, two versions of a device having X+S physical rows might be offered: a first version with X useable rows and another version with X+S useable rows, where S is the potential number of spare rows available to repair rows in a defective part. The first version (X useable rows) may be offered when any of the spare rows have been used to repair the device. If not all spare rows are used in the repair, other spare rows would be designated "bad" and not used. However, if there are no defective rows on the device, the second version may be offered and all of the spare rows may be activated, thus providing a device with X+S useable rows. In such an "X+S useable rows" device version, potentially more connections can be utilized to increase the total number of connections available for user designs relative to the number of connections in an "X useable rows" device version. Furthermore, the logical lengths of the vertical lines provided in such an X+S useable row device version could potentially be greater than the logical length of lines in the X useable row version of the same device. For example, referring to FIG. 1a, 1f, in a modified version of that figure, the row R+11 pathway via a connection 102 coupled to line 111b to a $B_n$ input of mux 124 were used in a normal mode, the logical length of that line would be five rather than four.

In other alternatives, more than two versions of a device may be offered including a variety of number of useable rows depending on how many spare rows have been needed to effect repair.

Figure 15:
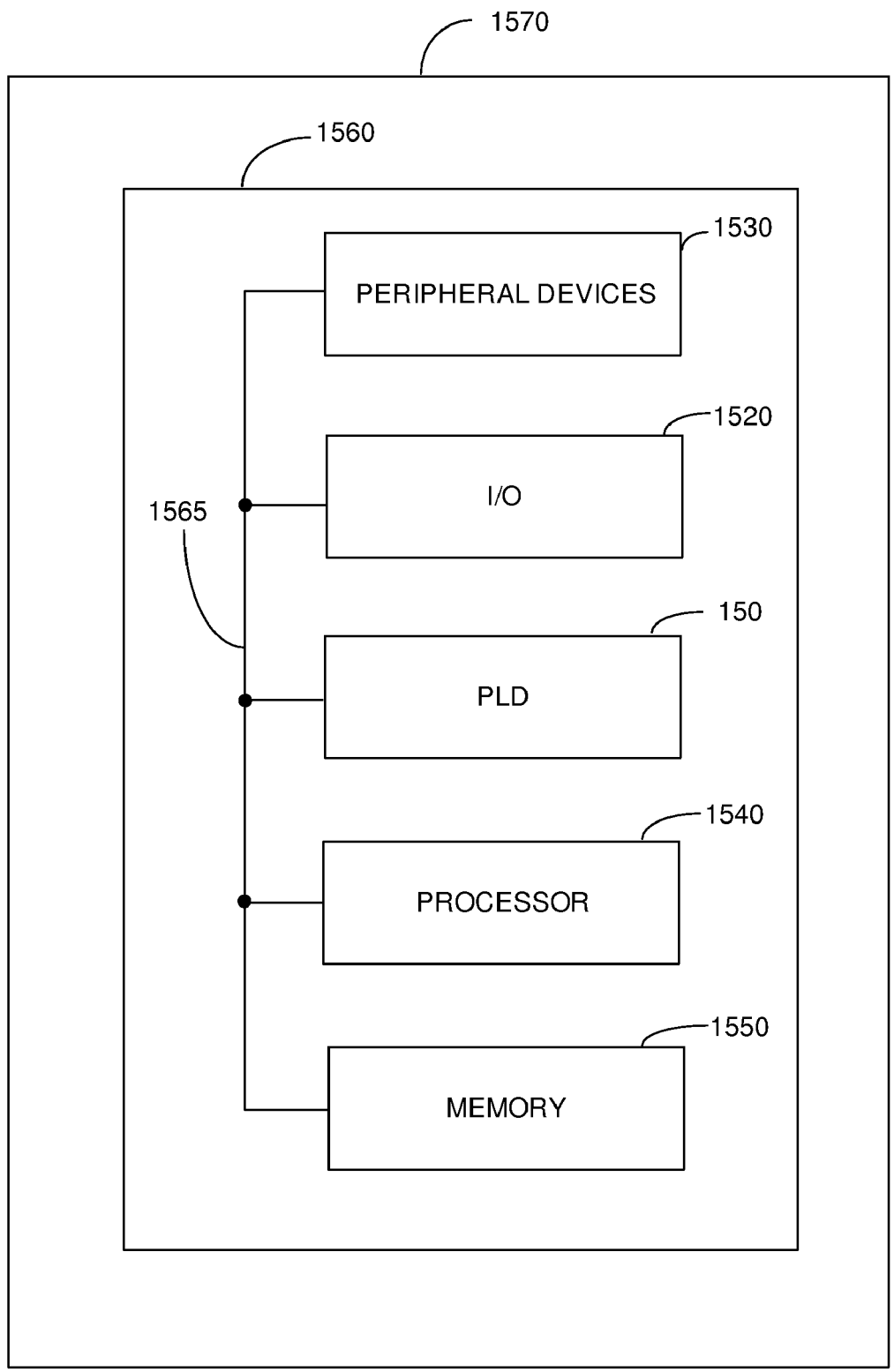
FIG. 15 illustrates a PLD 150 in accordance with the present invention in a data processing system 1500.

FIG. 15 illustrates a PLD 150 in accordance with the present invention in a data processing system 1500. Data processing system 1500 may include one or more of the following components: a processor 1540; memory 1550; I/O circuitry 1520; and peripheral devices 1530. These components are coupled together by a system bus 1565 and are populated on a circuit board 1560 which is contained in an end-user system 1570. A data processing system such as system 1500 may include a single end-user system such as end-user system 1570 or may include a plurality of systems working together as a data processing system.

System 1500 can be used in a wide variety of applications, such as computer networking, data networking, instrumentation, video processing, digital signal processing, or any other application where the advantage of using programmable or reprogrammable logic in system design is desirable. PLD 150 can be used to perform a variety of different logic functions. For example, programmable logic device 150 can be configured as a processor or controller that works in cooperation with processor 1540 (or, in alternative embodiments, a PLD might itself act as the sole system processor). PLD 150 may also be used as an arbiter for arbitrating access to shared resources in system 1500. In yet another example, PLD 150 can be configured as an interface between processor 1540 and one of the other components in system 1500. It should be noted that system 1500 is only exemplary.

Although embodiments of the present invention are described in the context of a programmable logic device having a row-based redundancy scheme (in which "vertical" lines are simply lines oriented to span multiple rows), the invention is equally applicable to programmable logic devices using column-based redundancy schemes (note that "horizontal" lines in a column-based scheme would cross multiple columns and thus would be equivalent to the vertical lines in a row based scheme). Because the terminology of rows and columns is relative to the orientation of the device, in a typical device having rows and columns perpendicular to each other, one may interchange the words row and column by merely rotating a device 90 degrees. For clarity, the present invention is described and claimed in terms of row-based arrangements, but the present description and claims apply equally to column-based redundancy arrangements.

Furthermore, although the term "row" is typically associated with a straight-line arrangement of items, alternative embodiments may employ row arrangements that are curved, or partially curved, or that have occasional jogs or gaps without necessarily departing from the spirit and scope of the present invention. Devices including such rows of varying orientation may still have a redundancy scheme that is within the scope of the present invention. Also, because a "vertical" line, as mentioned above, is defined herein as a line that spans multiple rows, a vertical line may similarly have different orientations along its length. It may also have just a portion that is vertical (i.e. spans multiple rows) while other portions are not vertical (i.e. not oriented to span multiple rows).

Although particular embodiments have been described in detail and certain variants have been noted, various other modifications to the embodiments described herein may be made without departing from the spirit and scope of the present invention, thus, the invention is limited only by the appended claims.

What is claimed is:

1. A computer readable medium comprising executable code that is executed by a computer, to cause the computer to generate programming data used to program a programmable logic device, the executable code comprising:
   an instruction to generate the programming data including a first set of redundancy information useable to implement at least one redundancy scheme for which the programmable logic device is adapted, wherein the first set of redundancy information is useable in combination with a second set of redundancy information stored on the programmable logic device to implement the at least one redundancy scheme.

2. A computer readable medium comprising executable code that is executed by a computer, to cause the computer to generate programming data used to program a programmable logic device, the executable code comprising:

a first instruction to generate the programming data indicative of whether a connection to be configured is a routing connection from a vertical line associated with a redundancy scheme for which the programmable logic device is adapted; and a second instruction to determine and include information in the programming data indicating whether the connection to the vertical line is upstream or downstream from a driver of the vertical line and information indicating a distance in rows between the connection and a row associated with a driver of the vertical line, wherein the second instruction is executed if the connection to be configured is a routing connection from the vertical line associated with the redundancy scheme.

3. The computer readable medium of claim 2 wherein the programming data is useable by the programmable logic device to configure the connection based upon the programming data and based upon bad row information stored on the programmable logic device.

4. The computer readable medium of claim 3 wherein the bad row information includes information indicative of or useable to indicate whether a bad row is between a row associated with the routing connection and a row associated with a driver of the vertical line.

5. The computer readable medium of claim 2 wherein the redundancy scheme is one of multiple redundancy schemes for which the programmable logic device is adapted.

6. A computer readable medium comprising executable code that is executed by a computer, to cause the computer to generate programming data used to program a programmable logic device, the executable code comprising:

a first instruction to generate the programming data indicative of whether a connection to be programmed is a routing connection from a vertical line associated with a redundancy scheme for which the programmable logic device is adapted; and a second instruction to determine and include information in the programming data indicative of possible bit values for configuring the connection and useable to select from the possible bit values based upon bad row information, wherein the second instruction is executed if the connection to be programmed is a routing connection from a vertical line associated with the redundancy scheme.

7. The computer readable medium of claim 6 wherein the executable code is also for at least, if the connection to be programmed is a routing connection from a vertical line associated with the redundancy scheme, including information in the programming data indicative of whether the connection is upstream or downstream of a row associated with a driver of the vertical line.

8. The computer readable medium of claim 6 wherein the bad row information includes information indicative of or useable to indicate whether a designated bad row is between a row associated with the connection and a row associated with a driver of the vertical line.

9. The computer readable medium of claim 6 wherein the bad row information includes information indicative of or useable to indicate a distance between the row associated with the connection and a designated bad row.

10. The computer readable medium of claim 6 wherein the bad row information is stored on the programmable logic device and is used in combination with the programming data by the programmable logic device to select from the possible bit values.

11. The computer readable medium of claim 6 wherein the bad row information is stored on the programmable logic device and is used in combination with the programming data by the programmable logic device to select from the possible bit values.

12. The computer readable medium of claim 6 wherein the redundancy scheme is one of multiple redundancy schemes for which the programmable logic device is adapted.

13. A computer readable medium comprising executable code that is executed by a computer, to cause the computer to generate programming data used to program a programmable logic device, the executable code comprising:

a first instruction to select between first and second vertical lines to provide input to a routing element, the first and second vertical lines being associated with a redundancy scheme for which the programmable logic device is adapted; and a second instruction to generate programming data for configuring the routing element to receive signals from the selected vertical line.

14. The computer readable medium of claim 13 wherein the executable code is also for at least:

determining, as part of selecting, whether a designated bad row is between a row associated with a driver of a vertical line and a row associated with the routing element.

15. The computer readable medium of claim 14 wherein the executable code is also for at least:

querying device data to identify designated bad rows of the programmable logic device.

16. The computer readable medium of claim 15 wherein the device data is stored on the programmable logic device.

17. The computer readable medium of claim 15 wherein the device data is stored in a memory device connectable to a computer executing the executable code.

18. The computer readable medium of claim 16 wherein the redundancy scheme is one of multiple redundancy schemes for which the programmable logic device is adapted.

19. The computer readable medium of claim 13 wherein the redundancy scheme is one of multiple redundancy schemes for which the programmable logic device is adapted.

* * * * *